United States Patent [19]

Padi

[11] Patent Number: 5,162,752

[45] Date of Patent: Nov. 10, 1992

[54] WORKING POINT ADJUSTING CIRCUIT FOR A SINGLE POWER AMPLIFIER HAVING MULTIPLE OUTPUT CHANNELS

[75] Inventor: Gyula Padi, Lancaster, Calif.

[73] Assignee: Josef Lakatos, Brunoy, France; a part interest

[21] Appl. No.: 796,699

[22] Filed: Nov. 21, 1991

Related U.S. Application Data

[63] Continuation-in-part of Ser. No. 588,584, Sep. 25, 1990, Pat. No. 5,070,308.

[51] Int. Cl.$^5$ .............................................. H03F 3/18
[52] U.S. Cl. .................................. 330/263; 330/268; 330/270
[58] Field of Search ..................... 330/263, 268, 270

[56] References Cited

U.S. PATENT DOCUMENTS

| | | | |
|---|---|---|---|
| 3,912,981 | 10/1975 | Tsurushima | 317/33 |
| 4,031,482 | 6/1977 | Tsurushima | 330/268 |
| 4,057,764 | 11/1977 | Yokoyama | 330/264 |
| 4,135,162 | 1/1979 | Takahashi | 330/267 |
| 4,160,216 | 7/1979 | Thornton | 330/267 |
| 4,165,494 | 8/1979 | Becker | 330/268 |
| 4,167,708 | 9/1979 | Goto | 330/264 |
| 4,178,559 | 12/1979 | Nichols | 330/296 |
| 4,220,930 | 9/1980 | Ahmed | 330/264 |
| 4,237,425 | 12/1980 | Spiegel | 330/263 |
| 4,342,966 | 8/1982 | Tamura | 330/268 |
| 4,404,528 | 9/1983 | Yamaguchi | 317/33 |
| 4,424,493 | 1/1984 | Schroeder | 330/267 |
| 4,454,479 | 6/1984 | Spires | 330/263 |
| 4,540,951 | 9/1985 | Ozawa et al. | 317/33 |
| 4,719,431 | 1/1988 | Karsten | 330/263 |
| 4,723,111 | 2/1988 | Verhoeven | 330/268 |

Primary Examiner—Eugene R. LaRoche
Assistant Examiner—R. A. Ratliff
Attorney, Agent, or Firm—Thomas I. Rozsa

[57] ABSTRACT

An improved working point adjusting circuit for a single power amplifier having multiple output circuits. When this simple circuit is connected to a Class B transistor power amplifier to support two or more output channels or speakers, it adjusts the working point of the transistors in the output circuit of the power amplifier to the linear portion of the current-voltage characteristics of the transistor so the amplifier works in the level of a Class A amplifier. It provides many significant advantages including (1) much higher energy efficiency on output transistors; (2) much less signal distortion on loaded speakers; (3) simple circuitry for increased reliability; (4) low component count for reduced costs; and (5) individualized adjustment for each output channels which eliminates the different effect caused by the very fine differences between the multiple loaded output devices such as loudspeakers.

70 Claims, 5 Drawing Sheets

WORKING POINT ADJUSTING CIRCUIT FOR A SINGLE POWER AMPLIFIER HAVING MULTIPLE OUTPUT CHANNELS

This is a continuation-in-part of copending application Ser. No. 07/588,584 filed on Sep. 25, 1990, U.S. Pat. No. 5,070,308.

BACKGROUND OF THE INVENTION

1. Field of the Invention

The present invention relates to electronic circuits. In particular, the present invention relates to power amplifiers.

2. Description of the Prior Art

In general, electronic power amplifier circuits have been produced in the prior art. The following prior art patents are representative of known electronic power amplifier circuits:

1. U.S. Pat. No. 4,719,431 issued to Karsten on Jan. 12, 1988 for "Audio Power Amplifier".
2. U.S. Pat. No. 4,165,494 issued to Becker on Aug. 21, 1979 for "Bi-State Linear Amplifier".
3. U.S. Pat. No. 4,167,708 issued to Goto on Sep. 11, 1979 for "Transistor Amplifier".
4. U.S. Pat. No. 4,135,162 issued to Takahashi on Jan. 16, 1979 for "Power Amplifier Circuits".
5. U.S. Pat. No. 4,424,493 issued to Schroeder on Jan. 3, 1984 for "Cross-Coupled Complementary Power Amplifier".
6. U.S. Pat. No. 4,540,951 issued to Ozawa et al. on Sep. 10, 1985 for "Amplifier Circuit".
7. U.S. Pat. No. 4,404,528 issued to Yamaguchi on Sep. 13, 1983 for "Output Amplifier".
8. U.S. Pat. No. 4,237,425 issued to Spiegel on Dec. 2, 1980 for "Automatic Bias Adjusting Circuit".
9. U.S. Pat. No. 4,220,930 issued to Ahmed on Sep. 2, 1980 for "Quasi-Linear Amplifier With Feedback-Controlled Idling Currents".
10. U.S. Pat. No. 4,031,482 issued to Tsurushima on Jun. 21, 1977 for "Bias Circuit For FET".
11. U.S. Pat. No. 4,454,479 issued to Spires on Jun. 12, 1984 for "Operational Amplifier With Improved Output Capability".
12. U.S. Pat. No. 4,342,966 issued to Tamura on Aug. 3, 1982 for "Power Amplifier Circuitry".
13. U.S. Pat. No. 3,912,981 issued to Tsurushima on Oct. 14, 1975 for "Protective Circuit For Field Effect Transistor Amplifier".
14. U.S. Pat. No. 4,057,764 issued to Yokoyama on Nov. 8, 1977 for "Amplifier".
15. U.S. Pat. No. 4,178,559 issued to Nichols on Dec. 11, 1979 for "Amplifier Distortion Reduction Apparatus".
16. U.S. Pat. No. 4,723,111 issued to Verhoeven et al. on Feb. 2, 1988 for "Amplifier Arrangement".

U.S. Pat. No. 4,719,431 issued to Karsten discloses an audio power amplifier which comprises a pair of input terminals, a pair of output terminals, a pair of matched output tubes and a pair of output power supplies, and all of which are connected to form a bridge circuit in the power amplifier circuitry. This power amplifier is capable of producing high output power levels over a wide frequency range and uses fairly few components. However, it is a double-ended electron tube amplifier.

U.S. Pat. No. 4,165,494 issued to Becker discloses a bi-state linear amplifier which is particularly adapted for use in modern computer data bus systems. This linear amplifier is selectively opened or closed in response to a separate input control signal. It uses diodes in its input and output circuits but the internal opening or closing status of the amplifier is not determined by the diode means, but rather by the separate input control signal.

U.S. Pat. No. 4,167,708 issued to Goto discloses a transistor amplifier which comprises an input stage circuit and an output stage circuit direct coupled to the input stage circuit. The input stage circuit includes the complementary symmetry transistors connected to the constant current circuit. The output stage circuit includes the complementary symmetry push-pull transistor amplifier. It uses a constant current circuit which comprises the field effect transistor (FET).

U.S. Pat. No. 4,135,162 issued to Takahashi discloses a power amplifier circuit which comprises two input differential amplifier circuits, one connecting complimentary symmetry circuit and two output complementary symmetry push-pull circuits. It uses a diode and a phrase-inverting transistor to form a single current mirror circuit between the second differential amplifier circuit and the complimentary symmetry circuit, and a series of diodes in the output complimentary symmetry push-pull circuit to form a biassing circuit. However, it uses FET's for first and second differential amplifiers and does not have a diode-transistor circuit to adjust the working point of the transistors.

U.S. Pat. No. 4,424,493 issued to Schroeder discloses a cross-coupled complementary power amplifier circuit which also uses a diode for the biassing circuit, but neither has a diode-transistor circuit to adjust the working point of the transistors.

U.S. Pat. No. 4,540,951 issued to Ozawa et al. discloses an amplifier circuit which comprises several circuits including a current mirror circuit and a DC feedback circuit to reduce non-linear distortion in the output signal caused by the base-emitter voltages of the transistors. It uses a circuit to maintain the current constant. However, the working point of the transistors in the output circuit is not adjustable.

U.S. Pat. No. 4,404,528 issued to Yamaguchi discloses an output amplifier which has four circuits comprising biasing transistors as well as output amplifying transistors. The attention of the circuit is focused on reducing the output waveform distortions and changes in the idling current corresponding to changes in the bias current.

U.S. Pat. No. 4,237,425 issued to Spiegel discloses an automatic bias adjusting circuit which is a double-ended bias adjusting circuit for a push-pull amplifier and also focused on the bias current stability.

U.S. Pat. No. 4,220,930 issued to Ahmed discloses a quasilinear amplifier with feedback-controlled idling currents which provides a circuit for establishing the idling currents in the Class AB push-pull output transistor amplifier stages.

U.S. Pat. No. 4,031,482 issued to Tsurushima discloses a bias circuit for FET which provides a circuit for compensating DC bias current changes in the drain of a field effect transistor (FET) caused by power supply fluctuations.

U.S. Pat. No. 4,454,479 issued to Spires discloses an operational amplifier with improved output capability which is focused on providing both maximum output voltage swing and high output current capability.

U.S. Pat. No. 4,342,966 issued to Tamura discloses another power amplifier circuitry which uses two internal batteries in the output stage circuit for passing the base currents of the output transistors to prevent the switching distortion.

U.S. Pat. No. 3,912,981 issued to Tsurushima discloses a protective circuit for field effect transistor (FET) amplifier which provides an improved protective circuit for an FET amplifier and is particularly adapted for use with an amplifier using at least one FET for amplifying purposes.

U.S. Pat. No. 4,057,764 issued to Yokoyama discloses an amplifier which is also an FET amplifier.

U.S. Pat. No. 4,178,559 issued to Nichols discloses an amplifier distortion reduction apparatus which uses diodes inserted in series with resistors in the output complimentary symmetry push-pull circuit serving as parallel impedance function elements so enough compensation can be obtained to reduce the distortion through the output amplifier circuit. However it reduces the nonlinearity by means of reducing the nonlinearity components of the output signal but does not initially cause the transistors to work at the most linear portion of their current-voltage characteristics.

U.S. Pat. No. 4,723,111 issued to Verhoeven et al. discloses an amplifier arrangement which is a particular configuration for output amplifiers operating in Class AB.

Overall, there are numerous power amplifier circuits. Some of them are for Class AB amplifiers, and some for FET amplifiers. However, none of the circuits of a Class B complimentary symmetry push-pull transistor audio power amplifier provide working point adjusting circuits and are instead fixed working point circuits.

Referring to FIG. 1, an example of known power amplifier circuits comprises a first NPN transistor Q1 and a second PNP transistor Q2 in the input stage, a third NPN transistor Q3 and a fourth PNP transistor Q4, where the base of Q1 is connected to first terminal A which is an input terminal and the base of Q2 is connected to second terminal B and where Q1 and Q3, Q2 and Q4 are respectively Darlington connected, a fifth NPN transistor Q5 and a sixth PNP transistor Q6 in the output stage, where Q3 and Q5, Q4 and Q6 are also respectively Darlington connected and where the collectors of Q1, Q3 and Q5 are connected to positive power supply B+ and the collectors of Q2, Q4 and Q6 are connected to negative power supply B−, a first resistor R1 which is connected between A and B+, a second resistor R2 which is connected between B and B−, a third resistor R3 which is connected between the bases of Q3 and Q4, a fourth resistor R4 which is connected between the emitters of Q3 and Q4, a fifth resistor R5 and a sixth resistor R6 which are connected between the respective emitters of Q5 and Q6 and the common third terminal C which is an output terminal, a seventh resistor R7, an eighth variable resistor R8, a ninth resistor R9, where R7, R8 and R9 are connected in series between A and B, a seventh NPN transistor Q7, a tenth resistor R10, where the base, collector and emitter of Q7 are connected to the variable end of R8, terminal A and terminal B through R10, respectively. The input stage differential amplifier circuit comprising Q1, Q2, R1 and R2 to which input signal is applied outputs two opposite phrase signals to the first complimentary circuit comprising Q3, Q4, R3 and R4 which form a current mirror circuit where the signal is converted into in-phase signal, therefore the second complimentary symmetry circuit comprising Q5, Q6, R5 and R6 in the output stage operates as a push-pull amplifier, and the bias circuit comprising R7, R8, R9, R10 and Q7 serves as a constant current means.

However, in this circuit the working point of the transistors can not be adjusted into the linear portion of their current-voltage characteristics so the distortion of the signal output to terminal C can not be eliminated and the energy efficiency of the output transistors is only about 70% and lost energy usually generates significant heat in the circuitry components.

The following prior art patent is also representative of known electronic power amplifier circuits:

17. U.S. Pat. No. 4,160,216 issued to Thornton on Jul. 3, 1979 for "Apparatus For Eliminating On-Off Transitional Gain Variations In Class AB, B And C Active Element Amplifier" (hereafter the "Thornton Patent").

The Thornton Patent discloses an improvement to an existing prior art amplifier circuit. After carefully comparing FIG. 4B to its corresponding prior art FIG. 4A, it is concluded that the four transistors 40A, 40B, 42A and 42B shown in FIG. 4B are existing transistors of the known prior art power amplifier circuit shown in FIG. 4A. The improvement provided by the Thornton Patent is the addition of the four diodes D40A, D40B, D44A and D44B. However, it does not include any transistors in its adjusting circuit, which substantially limits its ability.

The transistor-based adjusting circuit is desirable because it can adjust the working point of the transistors in the power amplifier circuit to a greater extent. It also can provide much less signal distortion and much more energy efficiency for power amplifiers. In addition it is very economical to have the means of making a Class B power amplifier work at the level of a Class A amplifier by simply using a working point adjusting circuit with only a few components in the power amplifier and without the high cost of the complicated construction of a Class A amplifier.

Another common feature of the prior art power amplifier circuits is that they typically have only one single output stage circuit which leads to a single output terminal. The single output terminal shown in the prior art FIG. 1 is marked as "C", or alternatively marked as "OUT" such as in FIG. 4B of the Thornton Patent. An output device, such as a loudspeaker, is connected to that output terminal. If the amplifier circuit is used to support two or more output devices, usually these output devices are connected to the single output terminal in a parallel relationship. However, using only one output stage circuit to support a multiplicity of output channels sometimes is not desirable, because it could result in power mismatch and sometimes even interference between the output devices such as loudspeakers. This is because output devices, even having the same model and power parameters, are not precisely identical due to the limitation in manufacturing. Therefore, for supporting multiple output channels or devices, it is desirable to have a multiple output stage circuit, such that each output channel or device is connected to an individual output stage circuit.

SUMMARY OF THE PRESENT INVENTION

The present invention is a working point adjusting circuit for a power amplifier.

It is well known that a complementary symmetry push-pull transistor audio power amplifier circuit is simple in arrangement, low in cost, has less distortion, and its operation is hardly affected by variations in the ambient temperature and the power source voltages.

However, the working point of the transistors used in the circuit is not at the very linear portion of the current-voltage characteristics of the transistors, which means that the signal input/output is somewhat nonlinear. These types of amplifiers are classified as Class B amplifiers.

It has been discovered, according to the present invention, that if the working point of the transistors in a Class B transistor amplifier circuit can be adjusted into the very linear portion of the current-voltage characteristics of the transistor, the energy efficiency of the amplifier can be further improved and the signal distortion can be further reduced, making the amplifier work like a Class A amplifier without the complicated arrangement and high cost of constructing a Class A amplifier.

It has been further discovered, according to the present invention, that the working point of the transistors in a power amplifier circuit can be adjusted into the very linear portion of the current-voltage characteristics of the transistor by the means of adding an internal cross-coupled diode-transistor working point adjusting circuit to the ordinary Class B complementary symmetry push-pull transistor audio power amplifier circuit.

It has been additionally discovered, according to present invention, that in a power amplifier with the working point adjusting circuit there is almost no energy lost at the output complementary paired transistors, and because the components in the circuitry operate at a lower current, it is much cooler.

It has further been discovered, according to present invention, that in a power amplifier with the working point adjusting circuit, it is desirable to have a multiple output stage circuit for supporting multiple output channels or output devices such as loudspeakers, since having only a single output stage circuit for supporting multiple output channels or output devices can result in power mismatch and sometimes even interference between the output devices.

It is therefore an object of the present invention to provide a working point adjusting circuit for a power amplifier which adjusts the working point of the transistors in the power amplifier circuit into the most linear portion of the current-voltage characteristics of the transistors so that the amplifier outputs much less signal distortion and operates with much higher energy efficiency.

It is a further object of the present invention to provide a very simple and economic means of making an ordinary Class B power amplifier work at the level of a Class A power amplifier.

It is an additional object of the present invention to provide a power amplifier with the working point adjusting circuit which has multiple output stage circuits for supporting multiple output channels or output devices such as loudspeakers, such that each output channel or device is connected to an individual output stage circuit, so that the prior art disadvantages such as power mismatch or interference between the output devices are eliminated.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DETAILED DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principle of the invention. Various changes and modifications obvious to one skilled in the art to which the invention pertains are deemed to be within the spirit, scope and contemplation of the invention as further defined in the appended claims.

Figure 1:
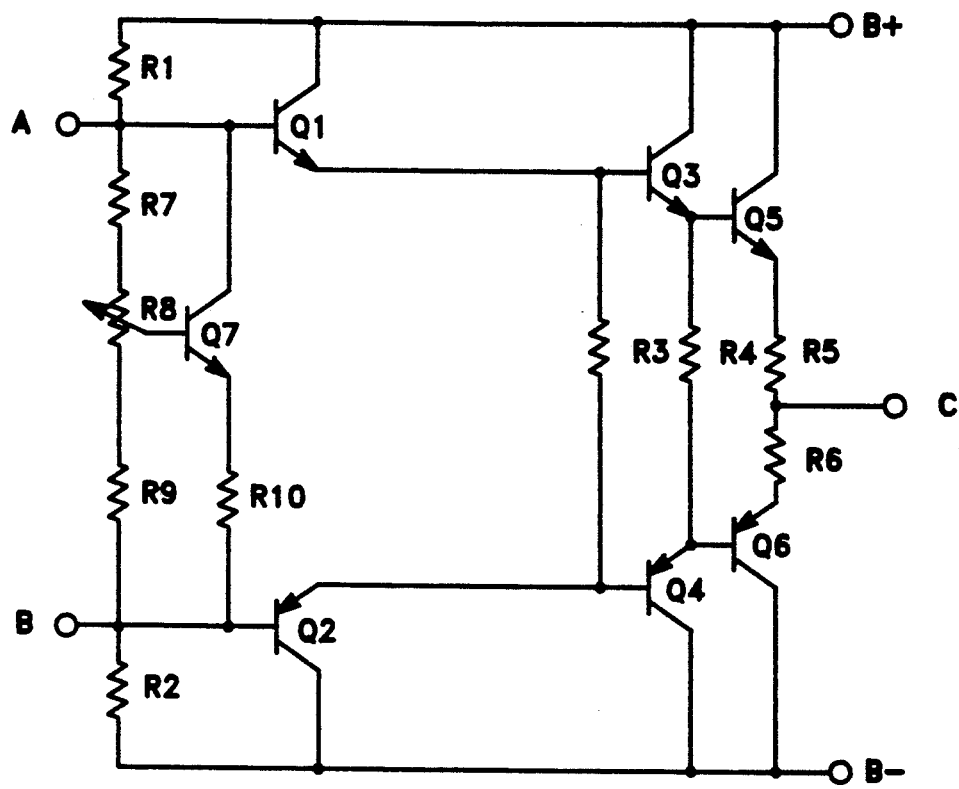
FIG. 1 is a schematic diagram of the circuitry of a known prior art complimentary symmetry push-pull transistor audio power amplifier.
Figure 2:
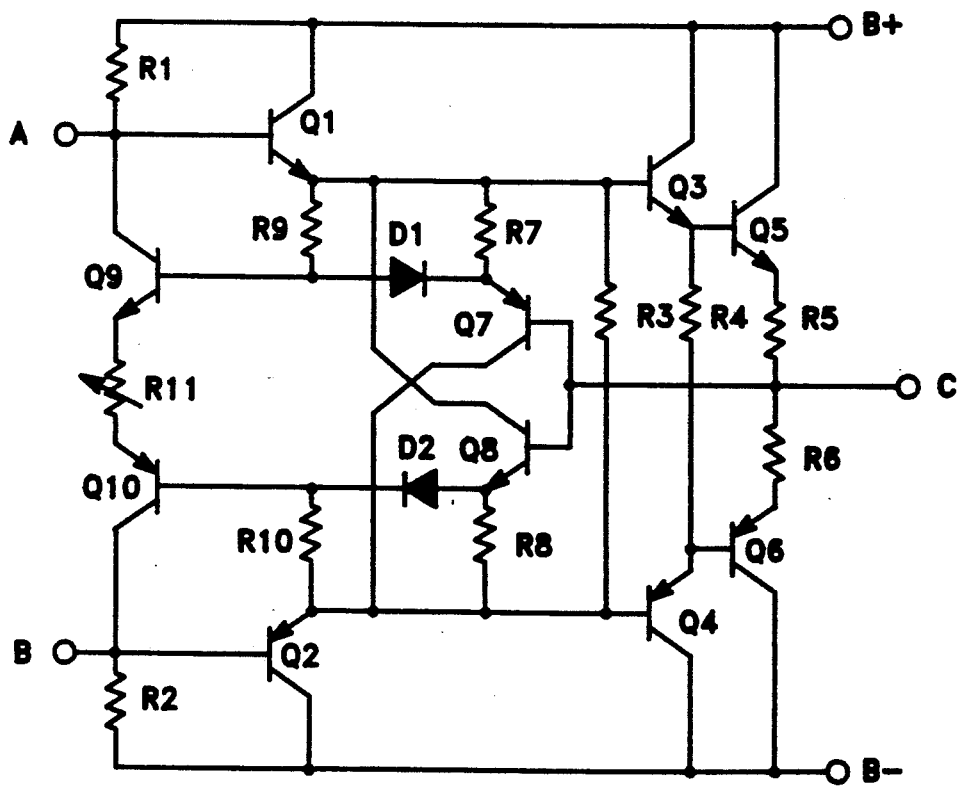
FIG. 2 is a schematic diagram of the circuitry of one of the preferred embodiments of the present invention.

Referring to FIG. 2, there is shown the schematic diagram of the circuitry of the preferred embodiment of the present invention. A complimentary symmetry push-pull transistor audio power amplifier with working point adjusting circuit comprises a first NPN transistor Q1 and a second PNP transistor Q2 in the input stage, a third NPN transistor Q3 and a fourth PNP transistor Q4, where the base of Q1 is connected to first terminal A which is an input terminal and the base of Q2 is connected to second terminal B and where Q1 and Q3, Q2 and Q4 are respectively Darlington connected, a fifth NPN transistor Q5 and a sixth PNP transistor Q6 in the output stage, where Q3 and Q5, Q4 and Q6 are also respectively Darlington connected and where the collectors of Q1, Q3 and Q5 are connected to positive power supply B+ and the collectors of Q2, Q4 and Q6 are connected to negative power supply B−, a first resistor R1 which is connected between A and B+, a second resistor R2 which is connected between B and B−, a third resistor R3 which is connected between the bases of Q3 and Q4, a fourth resistor R4 which is connected between the emitters of Q3 and Q4, a fifth resistor R5 and a sixth resistor R6 which are connected between the respective emitters of Q5 and Q6 and the common third terminal C which is an output terminal, where the input stage differential amplifier circuit comprising Q1, Q2, R1 and R2 to which input signal is applied outputs two opposite phase signals to the first complimentary circuit comprising Q3, Q4, R3 and R4 which form a current mirror circuit where the signal is converted into in-phrase signal, therefore the second complimentary symmetry circuit comprising Q5, Q6, R5 and R6 in the output stage operates as a push-pull amplifier, and further, in accordance with the present invention, a seventh PNP transistor Q7 and an eighth NPN transistor Q8 which are high input-impedance emitter-followers, where the bases of Q7 and Q8 are connected to terminal C and where the collector of Q7 is connected to the emitter of Q2 and the collector of Q8 is connected to the emitter of Q1, a first diode D1 and a second diode D2 which are rectifier diodes, where the cathode of D1 is connected to the emitter of Q7 and the anode of D2 is connected to the emitter of Q8, a ninth NPN transistor Q9 which is an emitter-follower, where the base and collector of Q9 are connected to the anode of D1 and terminal A respectively, a tenth PNP transistor Q10 which is an emitter-follower, where the base and collector of Q10 are connected to the cathode of D2 and terminal B respectively, a seventh resistor R7 which is a 120 ohm resistor and connected between the emitter of Q1 and the common connecting point of the cathode of D1 and the emitter of Q7, an eighth resistor R8 which is a 120 ohm resistor and connected between the emitter of Q2 and the common connecting point of the anode of D2 and the emitter of Q8, a ninth resistor R9 which is an 8.2 kilo-ohm resistor and connected between the emitter of Q1 and the common connecting point of the anode of D1 and the base of Q9, a tenth resistor R10 which is an 8.2 kilo-ohm resistor and connected between the emitter of Q2 and the common connecting point of the cathode of D2 and the base of Q10, and a eleventh variable resistor R11 connected between the emitters of Q9 and Q10, where transistors Q7, Q8, Q9 and Q10, diodes D1 and D2, resistors R7, R8, R9, R10 and variable resistor R11 form a working point adjusting circuit. The signal output to terminal C by the push-pull amplifier in turn feeds back to the bases of transistors Q7 and Q8 which are coupled to each other. When transistor Q8 opens, the current flowing out from the emitter of Q1 will in turn flow through Q8 which causes transistor Q10 to close. Similarly, when transistor Q7 opens, the transistor Q9 closes. The closed transistors Q9 and Q10 in the circuit create a higher voltage between the bases and emitters of the amplifying transistors which causes the working point of the transistors to move to the linear portion of the current-voltage characteristics of the transistor, which is the level of a Class A power amplifier.

Figure 3:
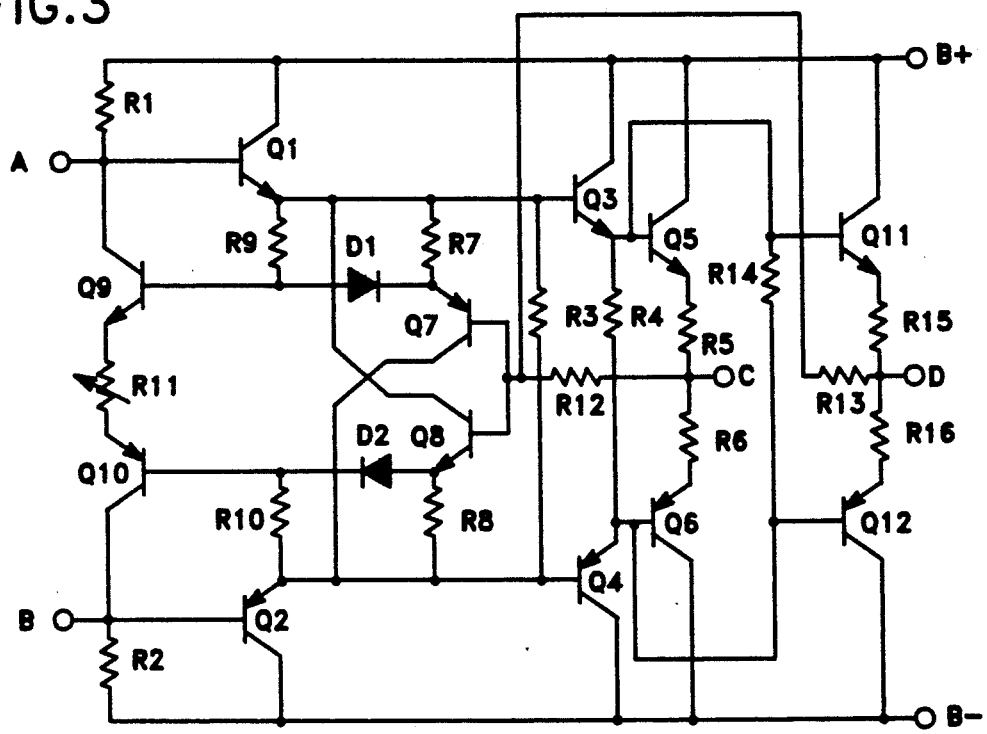
FIG. 3 is a schematic diagram of the circuitry of another preferred embodiment of the present invention, where the output circuit has two separate output stages supporting two output terminals respectively.

The improvement of the working point adjusting circuit is designed for supporting multiple output channels or devices. Referring to FIG. 3, there is shown a schematic diagram of the circuitry of another preferred embodiment of the present invention, where the output circuit has two separate output stages supporting two output terminals respectively. In addition to the circuit illustrated in FIG. 2 and described above, the second output circuit for supporting a second output terminal D comprises an eleventh NPN transistor Q11 and a twelfth PNP transistor Q12, where the collector of Q11 is connected to positive power supply B+ and the collector of Q12 is connected to negative power supply B−. The base of Q11 is connected to the common connecting point of the emitter of Q3 and the base of Q5, and the base of Q12 is connected to the common connecting point of the emitter of Q4 and the base of Q6. A twelfth resistor R12 is provided between the output terminal C and the coupling point of the bases of transistors Q7 and Q8, to thereby providing a feedback path from the first output terminal C to the working point adjusting circuit. A thirteenth resistor R13 is provided between the second output terminal D and the coupling point of the bases of transistors Q7 and Q8, to thereby providing a feedback path from the second output terminal D to the working point adjusting circuit. A fourteenth resistor R14 is connected between the bases of the transistors Q11 and Q12. A fifteenth resistor R15 and a sixteenth resistor R16 are connected between the respective emitters of Q11 and Q12 and the second output terminal D. The second output circuit formed by Q11, Q12, R15 and R16 operates as a push-pull amplifier independently supporting the second output terminal D. The signal output to terminal D by the push-pull amplifier in turn feeds back to the bases of transistors Q7 and Q8 which are coupled to each other. The working point adjusting circuit formed by transistors Q7, Q8, Q9 and Q10, diodes D1 and D2 and variable resistor R11 causes the working point of the transistors supporting both the first output and the second output terminals to move to the linear portion of the current-voltage characteristics of the transistor and functions in the level of a Class A power amplifier.

Figure 4:
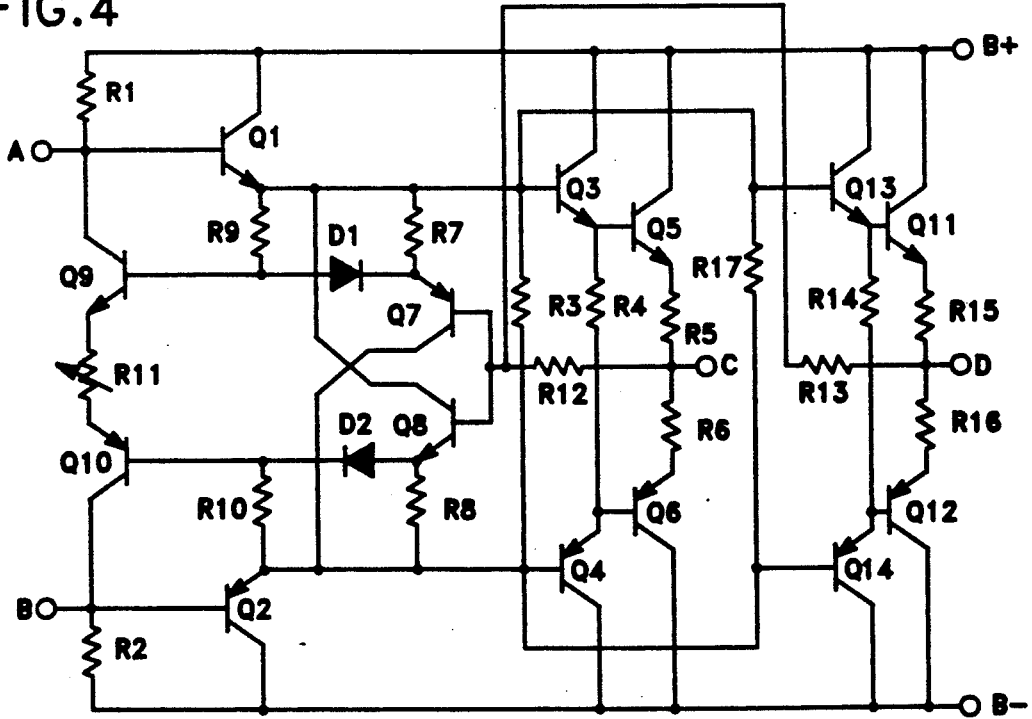
FIG. 4 is a schematic diagram of the circuitry of another preferred embodiment of the present invention, where the second output stage has two pairs of transistors.

Referring to FIG. 4, there is shown a schematic diagram of the circuitry of another preferred embodiment of the present invention, where the second output stage has two pairs of transistors. In addition to the circuit illustrated in FIG. 3 and described above, the second output circuit for supporting the second output terminal D further comprises a thirteenth NPN transistor Q13 and a fourteenth PNP transistor Q14, where the collector of Q13 is connected to positive power supply B+ and the collector of Q14 is connected to negative power supply B−. Now the base of Q11 is connected to the emitter of Q13, and the base of Q12 is connected to the emitter of Q14. The base of Q13 is connected to the common connecting point of the emitter of Q1 and the base of Q3, and the base of Q14 is connected to the common connecting point of the emitter of Q2 and the base of Q4. A seventeenth resistor R17 is connected between the bases of the transistors Q11 and Q12. The additional pair of transistors Q13 and Q14 further enhances the performance of the second output circuit supporting the second output terminal D.

Figure 5:
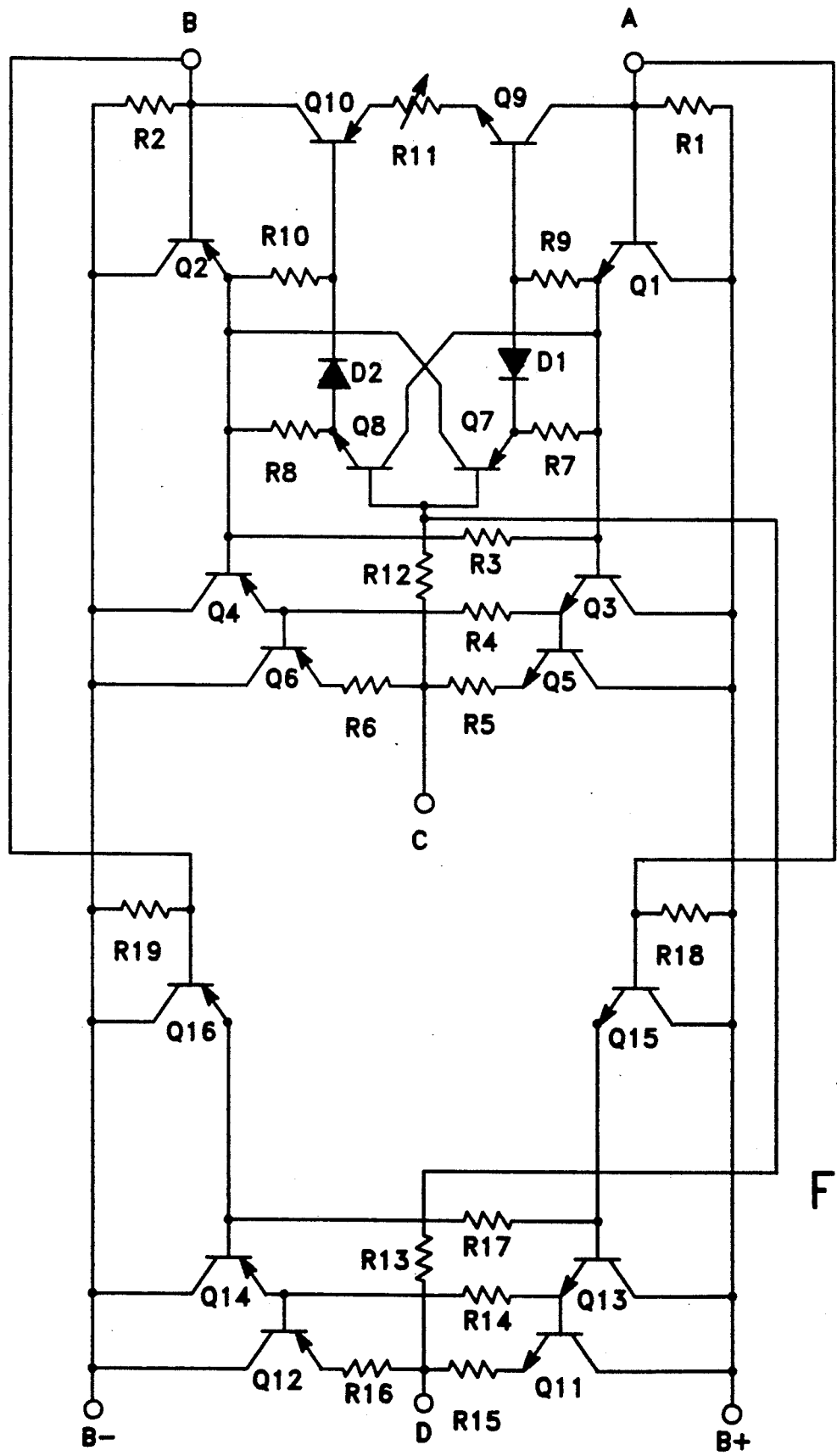
FIG. 5 is a schematic diagram of the circuitry of another preferred embodiment of the present invention, where the input circuit has two separate input stages supporting two separate output stages respectively.

Referring to FIG. 5, there is shown a schematic diagram of the circuitry of another preferred embodiment of the present invention, where the input circuit has two separate input stages supporting two separate output stages respectively. In addition to the circuit illustrated in FIG. 4 and described above, the circuit supporting the second output terminal D further comprises second input circuit, which includes a fifteenth NPN transistor Q15 and a sixteenth PNP transistor Q16, where the collector of Q15 is connected to positive power supply B+ and the collector of Q16 is connected to negative power supply B−. Now the base of Q13 is connected to the emitter of Q15, and the base of Q14 is connected to the emitter of Q16. The base of Q15 is connected to the first common terminal A, together with the base of the first transistor Q1, and the base of Q16 is connected to the second common terminal B, together with the base of the second transistor Q2. An eighteenth resistor R18 is connected between the base of Q15 and the positive power terminal B+, and a nineteenth resistor R19 is connected between the base of Q16 and the negative power terminal B−. The additional pair of transistors Q15 and Q16 further separates the second circuit supporting the second output terminal D from the original circuit supporting the first output circuit C, so the two output channels become more balanced.

Figure 6:
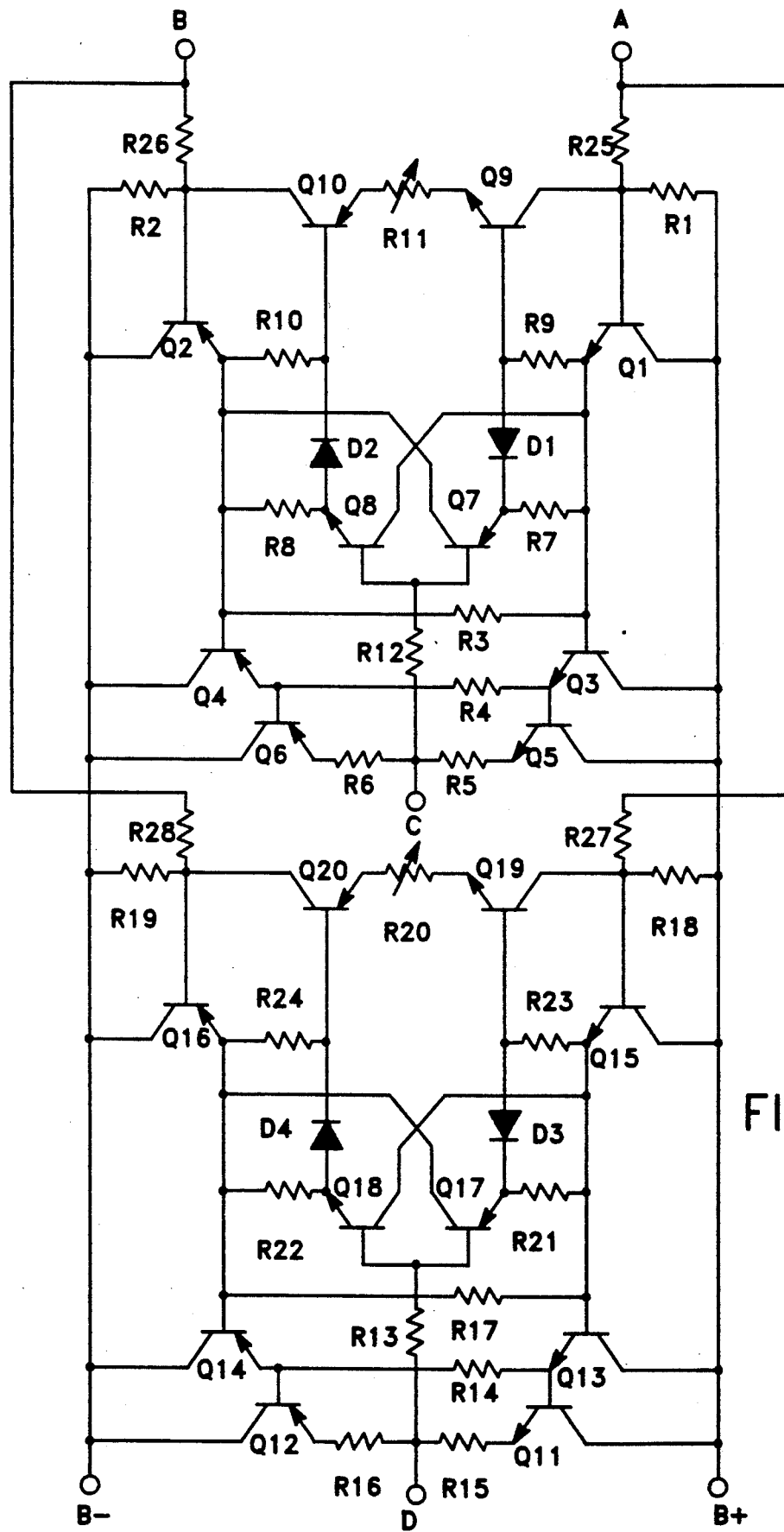
FIG. 6 is a schematic diagram of the circuitry of another preferred embodiment of the present invention, where the power amplifier circuit has two separate working point adjusting means for adjusting two separate output stages respectively.

Referring to FIG. 6, there is shown a schematic diagram of the circuitry of another preferred embodiment of the present invention, where the power amplifier circuit has two separate working point adjusting means for adjusting two separate output stages respectively. In addition to the circuit illustrated in FIG. 5 and described above, the circuit supporting the second output terminal D further comprises an additional working point adjusting circuit. The additional working point adjusting circuit comprises a seventeenth PNP transistor Q17, where the collector of Q17 is connected to the common connecting point of the base of the fourteenth transistor Q14 and the emitter of the sixteenth transistor Q16; and an eighteenth NPN transistor Q18, where the collector of Q18 is connected to the common connecting point of the base of the thirteenth transistor Q13 and the emitter of the fifteenth transistor Q15. The bases of Q17 and Q18 are connected together. Now the thirteenth resistor R13 is connected between the coupled bases of Q17 and Q18 and the second output terminal D. The additional working point adjusting circuit also comprises a third diode D3, where the cathode of D3 is connected to the emitter of the seventeenth transistor Q17; a fourth diode D4, where the anode of D4 is connected to the emitter of the eighteenth transistor Q18; a nineteenth NPN transistor Q19, where the collector of Q19 is connected to the base of Q15 and the base of Q19 is connected to the anode of the third diode D3; and a twentieth PNP transistor Q20, where the collector of Q20 is connected to the base of Q16 and the base of Q20 is connected to the cathode of the fourth diode D4. The additional working point adjusting circuit further comprises a twentieth variable resistor R20 connected between the emitters of Q19 and Q20; a twenty-first resistor R21 which is a 120 ohm resistor connected between the common connecting point of the base of Q13 and the emitter of Q15 and the common connecting point of the emitter of Q17 and the cathode of D3; a twenty-second resistor R22 which is also a 120 ohm resistor connected between the common connecting point of the base of Q14 and the emitter of Q16 and the common connecting point of the emitter of Q18 and the anode of D4; a twenty-third resistor R23 which is an 8.2 kilo-ohm resistor connected between the common connecting point of the base of Q13 and the emitter of Q15 and the common connecting point of the base of Q19 and the anode of D3; and a twenty-fourth resistor R24 which is also an 8.2 kilo-ohm resistor connected between the common connecting point of the base of Q14 and the emitter of Q16 and the common connecting point of the base of Q20 and the cathode of D4. The additional working point adjusting circuit formed primarily by Q17, Q18, Q19, Q20, D3, D4 and R20 provides independent adjustment of the working point of the transistors in the second output circuit, which supports the second output terminal D. In the first input stage circuit, a twenty-fifth resistor R25 is added between the first common terminal A and the common connecting point of the base of Q1 and the collector of Q9, a twenty-sixth resistor R26 is added between the second common terminal B and the common connecting point of the base of Q2 and the collector of Q10. In the second input stage circuit, a twenty-seventh resistor R27 is added between the first common terminal A and the common connecting point of the base of Q15 and the collector of Q19, a twenty-eighth resistor R28 is added between the second common terminal B and the common connecting point of the base of Q16 and the collector of Q20. The four resistors R25, R26, R27 and R28 provide proper balance between the first input stage circuit and the second input stage circuit.

Figure 7:
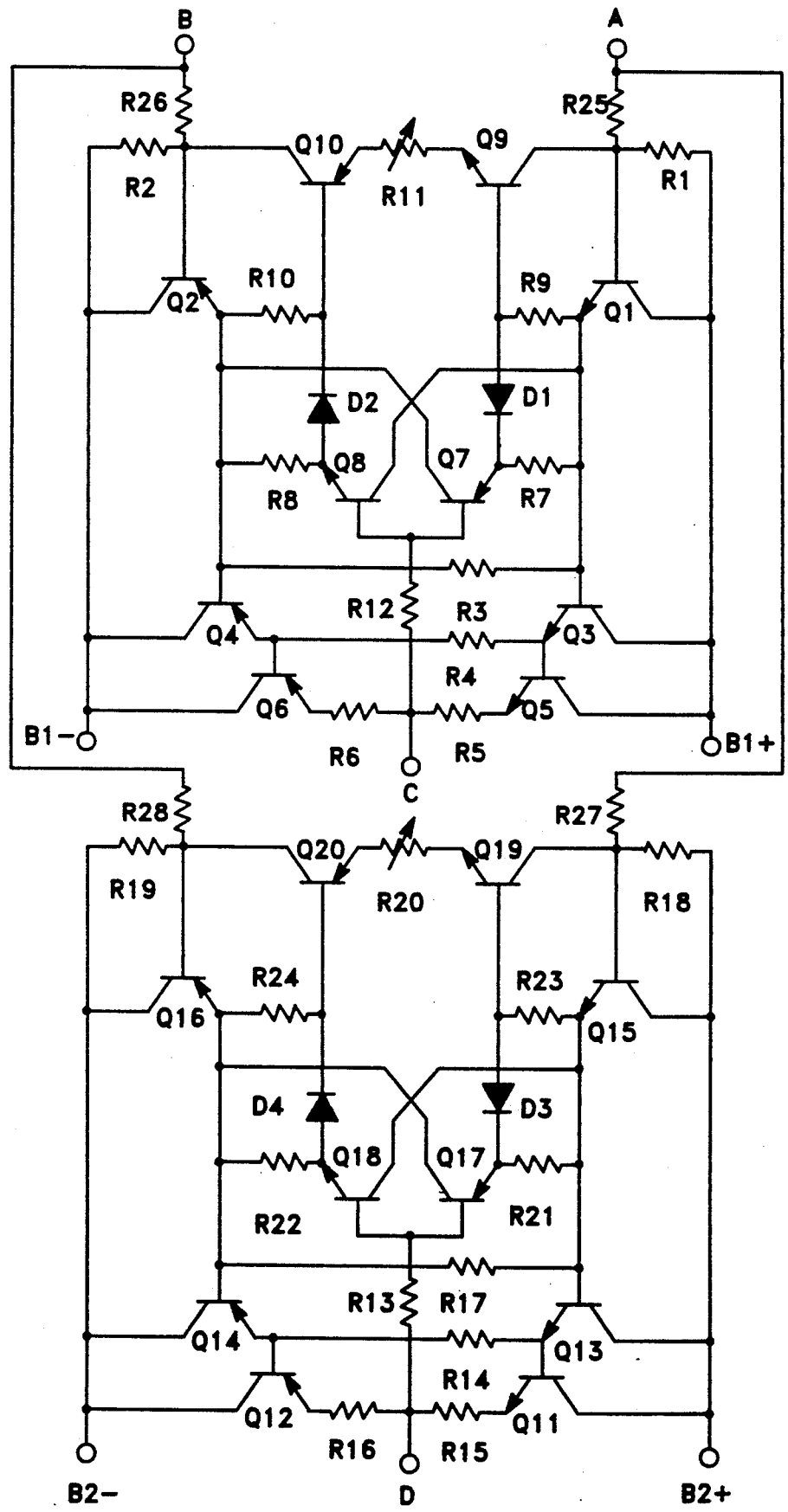
FIG. 7 is a schematic diagram of the circuitry of another preferred embodiment of the present invention similar to that shown in FIG. 6, but the second working point adjusting means and the second output stages circuit are connected to a separate power supply.

FIG. 7 is a schematic diagram of the circuitry of another preferred embodiment of the present invention similar to that shown in FIG. 6, but the second working point adjusting means and the second output stages circuit are connected to a separate power supply. Otherwise being the same, instead of using the same power supply, the circuit shown in FIG. 7 uses two power sources. The collectors of Q1, Q3 and Q5 of the first part of the circuit are connected to a first positive power terminal B1+, the collectors of Q2, Q4 and Q6 of the first part of the circuit are connected to a first negative power terminal B1−; the collectors of Q11, Q13 and Q15 of the second part of the circuit are connected to a second positive power terminal B2+, the collectors of Q12, Q14 and Q16 of the second part of the circuit are connected to a second negative power terminal B2−. Using separate power sources may provide better independence of the first and second part of the working point adjusting circuit.

It will be appreciated that the power amplifier circuit means disclosed here is not limited to two output terminals. In fact, the present invention power amplifier circuit may have multiple independent output stage circuits, with multiple independent input stage circuits, and multiple working point adjusting circuit means. The primary advantages of the present invention include: (1) much higher energy efficiency on output transistors; (2) much less signal distortion on loaded speakers; (3) simple circuitry for increased reliability; and (4) low component count for reduced costs; and (5) individualized adjustment for each output channel which eliminates the different effect caused by the very slight differences between the multiple loaded output devices such as loudspeakers.

Defined in detail, the present invention is, in a complimentary symmetry push-pull transistor audio power amplifier having a first NPN transistor and a second PNP transistor in an input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the first terminal and the positive power supply, a second resistor which is connected between the second terminal and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:

a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to said first terminal;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to said second terminal;
p. a seventh resistor connected between the emitter of said first transistor and the common connecting point of the cathode of said first diode and the emitter of said seventh transistor;
q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;
v. a second output stage supporting a second output terminal further comprising,
  (i) a thirteenth resistor connected between the common connecting point of said bases of said seventh and said eighth transistors and said second output terminal;
  (ii) an eleventh NPN transistor having its collector connected to said positive power supply and its base connected to the common connecting point of the emitter of said third transistor and the base of said fifth transistor;
  (iii) a twelfth PNP transistor having its collector connected to said negative power supply and its base connected to the common connecting point of the emitter of said fourth transistor and the base of said sixth transistor;
  (iv) a fourteenth resistor connected between said bases of said eleventh and said twelfth transistors;
  (v) a fifteenth resistor connected between the emitter of said eleventh transistor and said second output terminal; and
  (vi) a sixteenth resistor connected between the emitter of said twelfth transistor and said second output terminal.

Defined alternatively in detail, the present invention is, in a complimentary symmetry push-pull transistor audio power amplifier having a first NPN transistor and a second PNP transistor in an input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the first terminal and the positive power supply, a second resistor which is connected between the second terminal and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:

a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to said first terminal;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to said second terminal;
p. a seventh resistor connected between the emitter of said first transistor and the common connecting point of the cathode of said first diode and the emitter of said seventh transistor;

q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal; and
v. a second output stage supporting a second output terminal further comprising,
  (i) a thirteenth resistor connected between the common connecting point of said bases of said seventh and said eighth transistors and said second output terminal;
  (ii) an eleventh NPN transistor having its collector connected to said positive power supply;
  (iii) a twelfth PNP transistor having its collector connected to said negative power supply;
  (iv) a fourteenth resistor connected between said bases of said eleventh and said twelfth transistors;
  (v) a fifteenth resistor connected between the emitter of said eleventh transistor and said second output terminal;
  (vi) a sixteenth resistor connected between the emitter of said twelfth transistor and said second output terminal;
  (vii) a thirteenth NPN transistor having its collector connected to said positive power supply, its emitter connected to said base of said eleventh transistor and its base connected to the common connecting point of the emitter of said first transistor and the base of said third transistor;
  (viii) a fourteenth PNP transistor having its collector connected to said negative power supply, its emitter connected to said base of said twelfth transistor and its base connected to the common connecting point of the emitter of said second transistor and the base of said fourth transistor; and
  (ix) a seventeenth resistor connected between said bases of said thirteenth and said fourteenth transistors.

Defined also alternatively in detail, the present invention is, in a complimentary symmetry push-pull transistor audio power amplifier having a first NPN transistor and a second PNP transistor in a first input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the first terminal and the positive power supply, a second resistor which is connected between the second terminal and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:
a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to said first terminal;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to said second terminal;
p. a seventh resistor connected between the emitter of said first transistor and the common connecting point of the cathode of said first diode and the emitter of said seventh transistor;
q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;
v. a second output stage supporting a second output terminal further comprising,
  (i) a thirteenth resistor connected between the common connecting point of said bases of said seventh and said eighth transistors and said second output terminal;
  (ii) an eleventh NPN transistor having its collector connected to said positive power supply;

(iii) a twelfth PNP transistor having its collector connected to said negative power supply;
(iv) a fourteenth resistor connected between said bases of said eleventh and said twelfth transistors;
(v) a fifteenth resistor connected between the emitter of said eleventh transistor and said second output terminal;
(vi) a sixteenth resistor connected between the emitter of said twelfth transistor and said second output terminal;
(vii) a thirteenth NPN transistor having its collector connected to said positive power supply and its emitter connected to said base of said eleventh transistor;
(viii) a fourteenth PNP transistor having its collector connected to said negative power supply and its emitter connected to said base of said twelfth transistor;
(ix) a seventeenth resistor connected between said bases of said thirteenth and said fourteenth transistors;

w. a second input stage further comprising,
(i) an fifteenth NPN transistor having its collector connected to said positive power supply, its emitter connected to said base of said thirteenth transistor and its base connected to said first terminal;
(ii) a sixteenth PNP transistor having its collector connected to said negative power supply, its emitter connected to said base of said fourteenth transistor and its base connected to said second terminal;
(iii) an eighteenth resistor connected between the base of said fifteenth transistor and said positive power supply; and
(vi) an nineteenth resistor connected between the base of said sixteenth transistor and said negative power supply.

Defined again alternatively in detail, the present invention is, in a complimentary symmetry push-pull transistor audio power amplifier having a first terminal which is an input terminal, a second terminal, a first NPN transistor and a second PNP transistor in a first input stage, a third NPN transistor and a fourth PNP transistor, where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the base of the first transistor and the positive power supply, a second resistor which is connected between the base of the second transistor and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:

a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to the base of said first transistor;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to the base of said second transistor;
p. a seventh resistor connected between the emitter of said first transistor and the common connecting point of the cathode of said first diode and the emitter of said seventh transistor;
q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;
v. a second output stage supporting a second output terminal further comprising,
(i) an eleventh NPN transistor having its collector connected to said positive power supply;
(ii) a twelfth PNP transistor having its collector connected to said negative power supply;
(iii) a fourteenth resistor connected between said bases of said eleventh and said twelfth transistors;
(iv) a fifteenth resistor connected between the emitter of said eleventh transistor and said second output terminal;
(v) a sixteenth resistor connected between the emitter of said twelfth transistor and said second output terminal;
(vi) a thirteenth NPN transistor having its collector connected to said positive power supply and its emitter connected to said base of said eleventh transistor;
(vii) a fourteenth PNP transistor having its collector connected to said negative power supply and its emitter connected to said base of said twelfth transistor;
(viii) a seventeenth resistor connected between said bases of said thirteenth and said fourteenth transistors;

w. a second input stage further comprising,
  (i) an fifteenth NPN transistor having its collector connected to said positive power supply and its emitter connected to said base of said thirteenth transistor;
  (ii) a sixteenth PNP transistor having its collector connected to said negative power supply and its emitter connected to said base of said fourteenth transistor;
  (iii) an eighteenth resistor connected between the base of said fifteenth transistor and said positive power supply;
  (vi) an nineteenth resistor connected between the base of said sixteenth transistor and said negative power supply;
x. an additional working point adjusting circuit further comprising,
  (i) a seventeenth PNP transistor having its collector connected to the common connecting point of the base of said fourteenth transistor and the emitter of said sixteenth transistor;
  (ii) an eighteenth NPN transistor having its collector connected to the common connecting point of the base of said thirteenth transistor and the emitter of said fifteenth transistor and its base connected to the base of said seventeenth transistor;
  (iii) a thirteenth resistor connected between the common connecting point of said bases of said seventeenth and said eighteenth transistors and said second output terminal;
  (iv) a third diode having its cathode connected to the emitter of said seventeenth transistor;
  (v) a fourth diode having its anode connected to the emitter of said eighteenth transistor;
  (vi) a nineteenth NPN transistor having its collector connected to the base of said fifteenth transistor and its base connected to the anode of said third diode;
  (vii) a twentieth PNP transistor having its collector connected to the base of said sixteenth transistor and its base connected to the cathode of said fourth diode;
  (viii) a twentieth variable resistor connected between the emitters of said nineteenth and said twentieth transistors;
  (ix) a twenty-first resistor connected between the common connecting point of the base of said thirteenth transistor and the emitter of said fifteenth transistor and the common connecting point of the emitter of said seventeenth transistor and the cathode of said third diode;
  (x) a twenty-second resistor connected between the common connecting point of the base of said fourteenth transistor and the emitter of said sixteenth transistor and the common connecting point of the emitter of said eighteenth transistor and the anode of said fourth diode;
  (xi) a twenty-third resistor connected between the common connecting point of the base of said thirteenth transistor and the emitter of said fifteenth transistor and the common connecting point of the base of said nineteenth transistor and the anode of said third diode;
  (xii) a twenty-fourth resistor connected between the common connecting point of the base of said fourteenth transistor and the emitter of said sixteenth transistor and the common connecting point of the base of said twentieth transistor and the cathode of said fourth diode;
y. a circuit connecting means further comprising,
  (i) a twenty-fifth resistor connected between the first terminal and the common connecting point of the base of said first transistor and the collector of said nineth transistor;
  (ii) a twenty-sixth resistor connected between the second terminal and the common connecting point of the base of said second transistor and the collector of said tenth transistor;
  (iii) a twenty-seventh resistor connected between the first terminal and the common connecting point of the base of said fifteenth transistor and the collector of said nineteenth transistor; and
  (vi) a twenty-eighth resistor connected between the second terminal and the common connecting point of the base of said sixteenth transistor and the collector of said twentieth transistor.

Defined further alternatively in detail, the present invention is, in a complimentary symmetry push-pull transistor audio power amplifier having a first terminal which is an input terminal, a second terminal, a first NPN transistor and a second PNP transistor in a first input stage, a third NPN transistor and a fourth PNP transistor, where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a first positive power supply and the collectors of the second transistor, the fourth transistor and the sixth transistor are connected to a first negative power supply, a first resistor which is connected between the base of the first transistor and the first positive power supply, a second resistor which is connected between the base of the second transistor and the first negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:
a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to the base of said first transistor;
k. a second diode;
l. the anode of said second diode connected to the emitter of said eighth transistor;

m. a tenth transistor which is a PNP transistor;
n. the base said tenth transistor connected to the cathode of said second diode;
o. the collector of said tenth transistor connected to the base of said second transistor;
p. a seventh resistor connected between the emitter of said first transistor and the common connecting point of the cathode of said first diode and the emitter of said seventh transistor;
q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;
v. a second output stage supporting a second output terminal further comprising,
   (i) an eleventh NPN transistor having its collector connected to a second positive power supply;
   (ii) a twelfth PNP transistor having its collector connected to a second negative power supply;
   (iii) a fourteenth resistor connected between said bases of said eleventh and said twelfth transistors;
   (iv) a fifteenth resistor connected between the emitter of said eleventh transistor and said second output terminal;
   (v) a sixteenth resistor connected between the emitter of said twelfth transistor and said second output terminal;
   (vi) a thirteenth NPN transistor having its collector connected to said second positive power supply and its emitter connected to said base of said eleventh transistor;
   (vii) a fourteenth PNP transistor having its collector connected to said second negative power supply and its emitter connected to said base of said twelfth transistor;
   (viii) a seventeenth resistor connected between said bases of said thirteenth and said fourteenth transistors;
w. a second input stage further comprising,
   (i) an fifteenth NPN transistor having its collector connected to said second positive power supply and its emitter connected to said base of said thirteenth transistor;
   (ii) a sixteenth PNP transistor having its collector connected to said second negative power supply and its emitter connected to said base of said fourteenth transistor;
   (iii) an eighteenth resistor connected between the base of said fifteenth transistor and said second positive power supply;
   (vi) an nineteenth resistor connected between the base of said sixteenth transistor and said second negative power supply;
x. an additional working point adjusting circuit further comprising,
   (i) a seventeenth PNP transistor having its collector connected to the common connecting point of the base of said fourteenth transistor and the emitter of said sixteenth transistor;
   (ii) an eighteenth NPN transistor having its collector connected to the common connecting point of the base of said thirteenth transistor and the emitter of said fifteenth transistor and its base connected to the base of said seventeenth transistor;
   (iii) a thirteenth resistor connected between the common connecting point of said bases of said seventeenth and said eighteenth transistors and said second output terminal;
   (iv) a third diode having its cathode connected to the emitter of said seventeenth transistor;
   (v) a fourth diode having its anode connected to the emitter of said eighteenth transistor;
   (vi) a nineteenth NPN transistor having its collector connected to the base of said fifteenth transistor and its base connected to the anode of said third diode;
   (vii) a twentieth PNP transistor having its collector connected to the base of said sixteenth transistor and its base connected to the cathode of said fourth diode;
   (viii) a twentieth variable resistor connected between the emitters of said nineteenth and said twentieth transistors;
   (ix) a twenty-first resistor connected between the common connecting point of the base of said thirteenth transistor and the emitter of said fifteenth transistor and the common connecting point of the emitter of said seventeenth transistor and the cathode of said third diode;
   (x) a twenty-second resistor connected between the common connecting point of the base of said fourteenth transistor and the emitter of said sixteenth transistor and the common connecting point of the emitter of said eighteenth transistor and the anode of said fourth diode;
   (xi) a twenty-third resistor connected between the common connecting point of the base of said thirteenth transistor and the emitter of said fifteenth transistor and the common connecting point of the base of said nineteenth transistor and the anode of said third diode;
   (xii) a twenty-fourth resistor connected between the common connecting point of the base of said fourteenth transistor and the emitter of said sixteenth transistor and the common connecting point of the base of said twentieth transistor and the cathode of said fourth diode;
y. a circuit connecting means further comprising,
   (i) a twenty-fifth resistor connected between the first terminal and the common connecting point of the base of said first transistor and the collector of said nineth transistor;
   (ii) a twenty-sixth resistor connected between the second terminal and the common connecting point of the base of said second transistor and the collector of said tenth transistor;
   (iii) a twenty-seventh resistor connected between the first terminal and the common connecting point of the base of said fifteenth transistor and the collector of said nineteenth transistor; and (vi) a twenty-eighth resistor connected between the second terminal and the common connecting point of the base of said sixteenth transistor and the collector of said twentieth transistor.

Defined broadly, the present invention is, for a power amplifier circuit having an input circuit means including at least one transistor connected to an input terminal, two output push-pull power amplifier circuit means supporting two output terminals respectively, each output circuit means including at least one pair of amplifying transistors connected to a respective one of the two output terminals, and means for connecting the input and the two output circuit means together and to a power supply means, a working point adjusting circuit, comprising, a. a pair of switching transistor means and a pair of biasing transistor means, in addition to said at least one transistor means of said input circuit means and said at least one pair of transistors means of each one of said two output circuit means of said power amplifier circuit, where the bases of the pair of switching transistor means are connected to each of said two output terminals, and the collectors of the pair of biasing transistor means are connected to said input terminal;

b. a first diode means connected between the emitter of a respective one of said pair of switching transistor means and the base of a respective one of said pair of biasing transistor means, where the respective one of said pair of switching transistor means and the first diode means act to provide a first switching means, which when open, causes the respective one of said pair of biasing transistor means to be closed;

c. a second diode means connected between the emitter of another respective one of said pair of switching transistor means and the base of another respective one of said pair of biasing transistor means, where the other respective one of said pair of switching transistor means and the second diode means act to provide a second switching means, which when open, causes the other respective one of said pair of biasing transistor means to be closed;

d. a variable resistor connected between the emitters of said pair of biasing transistor means; and e. circuit connector means for connecting said working point adjusting circuit to said power amplifier circuit.

Alternatively defined broadly, the present invention is, for a power amplifier circuit having two input circuit means each including at least one transistor connected to an input terminal, two output push-pull power amplifier circuit means supporting two output terminals respectively, each output circuit means including at least one pair of amplifying transistors connected to a respective one of the two output terminals, and means for connecting the two input and the two output circuit means together and to a power supply means, a working point adjusting circuit, comprising, a. a pair of switching transistor means and a pair of biasing transistor means, in addition to said at least one transistor means of each one of said two input circuit means and said at least one pair of transistors means of each one of said two output circuit means of said power amplifier circuit, where the bases of the pair of switching transistor means are connected to each of said two output terminals, and the collectors of the pair of biasing transistor means are connected to said input terminal;

b. a first diode means connected between the emitter of a respective one of said pair of switching transistor means and the base of a respective one of said pair of biasing transistor means, where the respective one of said pair of switching transistor means and the first diode means act to provide a first switching means, which when open, causes the respective one of said pair of biasing transistor means to be closed;

c. a second diode means connected between the emitter of another respective one of said pair of switching transistor means and the base of another respective one of said pair of biasing transistor means, where the other respective one of said pair of switching transistor means and the second diode means act to provide a second switching means, which when open, causes the other respective one of said pair of biasing transistor means to be closed;

d. a variable resistor connected between the emitters of said pair of biasing transistor means; and e. circuit connector means for connecting said working point adjusting circuit to said power amplifier circuit.

Also alternatively defined broadly, the present invention is, for a power amplifier circuit having two input circuit means each including at least one transistor connected to an input terminal, two output push-pull power amplifier circuit means supporting two output terminals respectively, each output circuit means including at least one pair of amplifying transistors connected to a respective one of the two output terminals, and means for connecting the two input and the two output circuit means to two power supply means respectively, a working point adjusting circuit, comprising, a. a first pair of switching transistor means and a first pair of biasing transistor means, in addition to said at least one transistor means of each one of said two input circuit means and said at least one pair of transistors means of each one of said two output circuit means of said power amplifier circuit, where the bases of the first pair of switching transistor means are connected to a first one of said two output terminals, and the collectors of the first pair of biasing transistor means are connected to said input terminal;

b. a first diode means connected between the emitter of a respective one of said first pair of switching transistor means and the base of a respective one of said first pair of biasing transistor means, where the respective one of said first pair of switching transistor means and the first diode means act to provide a first switching means, which when open, causes the respective one of said first pair of biasing transistor means to be closed;

c. a second diode means connected between the emitter of another respective one of said first pair of switching transistor means and the base of another respective one of said first pair of biasing transistor means, where the other respective one of said first pair of switching transistor means and the second diode means act to provide a second switching means, which when open, causes the other respective one of said first pair of biasing transistor means to be closed;

d. a first variable resistor connected between the emitters of said first pair of biasing transistor means;

e. a second pair of switching transistor means and a second pair of biasing transistor means, in addition to said at least one transistor means of each one of said two input circuit means and said at least one pair of transistors means of each one of said two output circuit means of said power amplifier circuit, where the bases of the second pair of switching transistor means are connected to a second one of said two output terminals, and the collectors of the second pair of biasing transistor means are connected to said input terminal;

f. a third diode means connected between the emitter of a respective one of said second pair of switching transistor means and the base of a respective one of said second pair of biasing transistor means, where the respective one of said second pair of switching transistor means and the third diode means act to provide a third switching means, which when open, causes the respective one of said second pair of biasing transistor means to be closed;

g. a fourth diode means connected between the emitter of another respective one of said second pair of switching transistor means and the base of another respective one of said second pair of biasing transistor means, where the other respective one of said second pair of switching transistor means and the fourth diode means act to provide a fourth switching means, which when open, causes the other respective one of said second pair of biasing transistor means to be closed;

h. a second variable resistor connected between the emitters of said first pair of biasing transistor means; and i. circuit connector means for connecting said working point adjusting circuit to said power amplifier circuit.

Defined more broadly, the present invention is, for a power amplifier circuit having a multiplicity of input circuit means each including at least one transistor connected to an input terminal, a multiplicity of output push-pull power amplifier circuit means supporting a multiplicity of output terminals respectively, each output circuit means including at least one pair of amplifying transistors connected to a respective one of the multiplicity of output terminals, and means for connecting the multiplicity of input and the multiplicity of output circuit means to a multiplicity of power supply means respectively, a working point adjusting circuit comprising a multiplicity of working point adjusting means, each one of the multiplicity of working point adjusting means further comprising, a. a pair of switching transistor means and a pair of biasing transistor means, in addition to said at least one transistor means of each one of said multiplicity of input circuit means and said at least one pair of transistors means of each one of said multiplicity of output circuit means of said power amplifier circuit, where the bases of the pair of switching transistor means are connected to a respective one of said multiplicity of output terminals, and the collectors of the pair of biasing transistor means are connected to said input terminal;

b. a first diode means connected between the emitter of a respective one of said pair of switching transistor means and the base of a respective one of said pair of biasing transistor means, where the respective one of said pair of switching transistor means and the first diode means act to provide a first switching means, which when open, causes the respective one of said pair of biasing transistor means to be closed;

c. a second diode means connected between the emitter of another respective one of said pair of switching transistor means and the base of another respective one of said pair of biasing transistor means, where the other respective one of said pair of switching transistor means and the second diode means act to provide a second switching means, which when open, causes the other respective one of said pair of biasing transistor means to be closed;

d. a variable resistor connected between the emitters of said pair of biasing transistor means; and e. circuit connector means for connecting said working point adjusting means to said power amplifier circuit.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus is intended only for illustration and for disclosure of an operative embodiment and not to show all of the various forms or modification in which the invention might be embodied or operated.

The invention has been described in considerable detail in order to comply with the patent laws by providing full public disclosure of at least one of its forms. However, such detailed description is not intended in any way to limit the broad features or principles of the invention, or the scope of patent monopoly to be granted.

What is claimed is:

1. In a complimentary symmetry push-pull transistor audio power amplifier having a first NPN transistor and a second PNP transistor in an input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the first terminal and the positive power supply, a second resistor which is connected between the second terminal and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:

a. a seventh transistor which is a PNP transistor;

b. the collector of said seventh transistor connected to the emitter of said second transistor;

c. an eighth transistor which is an NPN transistor;

d. the base of said eighth transistor connected to said base of said seventh transistor;

e. the collector of said eighth transistor connected to the emitter of said first transistor;

f. a first diode;

g. the cathode of said first diode connected to the emitter of said seventh transistor;

h. a ninth transistor which is an NPN transistor;
i. the base of said ninth transistor connected to the anode of said first diode;
j. the collector of said ninth transistor connected to said first terminal;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to said second terminal;
p. a seventh resistor connected between the emitter of said first transistor and the common connecting point of the cathode of said first diode and the emitter of said seventh transistor;
q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;
v. a second output stage supporting a second output terminal further comprising,
 (i) a thirteenth resistor connected between the common connecting point of said bases of said seventh and said eighth transistors and said second output terminal;
 (ii) an eleventh NPN transistor having its collector connected to said positive power supply and its base connected to the common connecting point of the emitter of said third transistor and the base of said fifth transistor;
 (iii) a twelfth PNP transistor having its collector connected to said negative power supply and its base connected to the common connecting point of the emitter of said fourth transistor and the base of said sixth transistor;
 (iv) a fourteenth resistor connected between said bases of said eleventh and said twelfth transistors;
 (v) a fifteenth resistor connected between the emitter of said eleventh transistor and said second output terminal; and
 (vi) a sixteenth resistor connected between the emitter of said twelfth transistor and said second output terminal.

2. A working point adjusting circuit in accordance with claim 1 wherein said seventh transistor and said eighth transistor are high input-impedance emitter-followers.

3. A working point adjusting circuit in accordance with claim 1 wherein said ninth transistor and said tenth transistor are emitter-followers.

4. A working point adjusting circuit in accordance with claim 1 wherein said first diode and second diode are rectifier diodes.

5. A working point adjusting circuit in accordance with claim 1 whereby when said circuit connection means is connected to a Class B complimentary symmetry push-pull transistor audio power amplifier, the working point of said transistors in the first and second output stages of said amplifier is adjusted to the level of a Class A power amplifier.

6. In a complimentary symmetry push-pull transistor audio power amplifier having a first NPN transistor and a second PNP transistor in an input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to negative power supply, a first resistor which is connected between the first terminal and a positive power supply, a second resistor which is connected between the second terminal and a negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:
a. a seventh transistor which is a PNP transistor;
b. the collector of said seventh transistor connected to the emitter of said second transistor;
c. an eighth transistor which is an NPN transistor;
d. the base of said eighth transistor connected to base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to said first terminal;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to said second terminal;
p. a seventh resistor which is a 120 ohm resistor connected between the emitter of said first transistor and the common connecting point of the cathode of said first diode and the emitter of said seventh transistor;

q. an eighth resistor which is a 120 ohm resistor connected between the emitter of said second transistor and the common connecting point of the anode of said second diode and the emitter of said eighth transistor;
r. a ninth resistor which is a 8.2 kilo-ohm resistor connected between the emitter of said first transistor and the common connecting point of the anode of said first diode and the base of said ninth transistor;
s. a tenth resistor which is a 8.2 kilo-ohm resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eight transistors and said first output terminal;
v. a second output stage supporting a second output terminal further comprising,
   (i) a thirteenth resistor connected between the common connecting point of said bases of said seventh and said eighth transistors and said second output terminal;
   (ii) an eleventh NPN transistor having its collector connected to said positive power supply and its base connected to the common connecting point of the emitter of said third transistor and the base of said fifth transistor;
   (iii) a twelfth PNP transistor having its collector connected to said negative power supply and its base connected to the common connecting point of the emitter of said fourth transistor and the base of said sixth transistor;
   (iv) a fourteenth resistor connected between said bases of said eleventh and said twelfth transistors;
   (v) a fifteenth resistor connected between the emitter of said eleventh transistor and said second output terminal; and
   (vi) a sixteenth resistor connected between the emitter of said twelfth transistor and said second output terminal.

7. A working point adjusting circuit in accordance with claim 6 wherein said seventh transistor and said eighth transistor are high input-impedance emitter-follower.

8. A working point adjusting circuit in accordance with claim 6 wherein said ninth transistor and said tenth transistor are emitter-followers.

9. A working point adjusting circuit in accordance with claim 6 wherein said first diode and second diode are rectifier diodes.

10. A working point adjusting circuit in accordance with claim 6 whereby when said circuit connection means is connected to a Class B complimentary symmetry push-pull transistor audio power amplifier, the working point of said transistors in the first and second output stages of said amplifier is adjusted to the level of a Class A power amplifier.

11. In a complimentary symmetry push-pull transistor audio power amplifier having a first NPN transistor and a second PNP transistor in an input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the first terminal and the positive power supply, a second resistor which is connected between the second terminal and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:

a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to said first terminal;
k. a second diode;
l. the anode of said second diode connected to the emitter of said eighth transistor; m. a tenth transistor which is a PNP transistor;
n. the base said tenth transistor connected to the cathode of said second diode;
o. the collector of said tenth transistor connected to said second terminal;
p. a seventh resistor connected between the emitter of said first transistor and the common connecting point of the cathode of said first diode and the emitter of said seventh transistor;
q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;
t. an eleventh variable resistor connected between the emitters of said ninth transistor and said tenth transistor;

u. a twelfth resistor connected between the common connecting point of said bases of said seventh and said eighth transistors and said first output terminal;

v. a second output stage supporting a second output terminal further comprising,
  (i) a thirteenth resistor connected between the common connecting point of said bases of said seventh and said eighth transistors and said second output terminal;
  (ii) an eleventh NPN transistor having its collector connected to said positive power supply;
  (iii) a twelfth PNP transistor having its collector connected to said negative power supply;
  (iv) a fourteenth resistor connected between said bases of said eleventh and said twelfth transistors;
  (v) a fifteenth resistor connected between the emitter of said eleventh transistor and said second output terminal;
  (vi) a sixteenth resistor connected between the emitter of said twelfth transistor and said second output terminal;
  (vii) a thirteenth NPN transistor having its collector connected to said positive power supply, its emitter connected to said base of said eleventh transistor and its base connected to the common connecting point of the emitter of said first transistor and the base of said third transistor;
  (viii) a fourteenth PNP transistor having its collector connected to said negative power supply, its emitter connected to said base of said twelfth transistor and its base connected to the common connecting point of the emitter of said second transistor and the base of said fourth transistor; and
  (ix) a seventeenth resistor connected between said bases of said thirteenth and said fourteenth transistors.

12. A working point adjusting circuit in accordance with claim 11 wherein said seventh transistor and said eighth transistor are high input-impedance emitter-followers.

13. A working point adjusting circuit in accordance with claim 11 wherein said ninth transistor and said tenth transistor are emitter-followers.

14. A working point adjusting circuit in accordance with claim 11 wherein said first diode and second diode are rectifier diodes.

15. A working point adjusting circuit in accordance with claim 11 whereby when said circuit connection means is connected to a Class B complimentary symmetry push-pull transistor audio power amplifier, the working point of said transistors in the first and second output stages of said amplifier is adjusted to the level of a Class A power amplifier.

16. In a complimentary symmetry push-pull transistor audio power amplifier having a first NPN transistor and a second PNP transistor in an input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to negative power supply, a first resistor which is connected between the first terminal and a positive power supply, a second resistor which is connected between the second terminal and a negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:

a. a seventh transistor which is a PNP transistor;
b. the collector of said seventh transistor connected to the emitter of said second transistor;
c. an eighth transistor which is an NPN transistor;
d. the base of said eighth transistor connected to base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to said first terminal;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to said second terminal;
p. a seventh resistor which is a 120 ohm resistor connected between the emitter of said first transistor and the common connecting point of the cathode of said first diode and the emitter of said seventh transistor;
q. an eighth resistor which is a 120 ohm resistor connected between the emitter of said second transistor and the common connecting point of the anode of said second diode and the emitter of said eighth transistor;
r. a ninth resistor which is a 8.2 kilo-ohm resistor connected between the emitter of said first transistor and the common connecting point of the anode of said first diode and the base of said ninth transistor;
s. a tenth resistor which is a 8.2 kilo-ohm resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;

v. a second output stage supporting a second output terminal further comprising,
  (i) a thirteenth resistor connected between the common connecting point of said bases of said seventh and said eighth transistors and said second output terminal;
  (ii) an eleventh NPN transistor having its collector connected to said positive power supply;
  (iii) a twelfth PNP transistor having its collector connected to said negative power supply;
  (iv) a fourteenth resistor connected between said bases of said eleventh and said twelfth transistors;
  (v) a fifteenth resistor connected between the emitter of said eleventh transistor and said second output terminal;
  (vi) a sixteenth resistor connected between the emitter of said twelfth transistor and said second output terminal;
  (vii) a thirteenth NPN transistor having its collector connected to said positive power supply, its emitter connected to said base of said eleventh transistor and its base connected to the common connecting point of the emitter of said first transistor and the base of said third transistor;
  (viii) a fourteenth PNP transistor having its collector connected to said negative power supply, its emitter connected to said base of said twelfth transistor and its base connected to the common connecting point of the emitter of said second transistor and the base of said fourth transistor; and
  (ix) a seventeenth resistor connected between said bases of said thirteenth and said fourteenth transistors.

17. A working point adjusting circuit in accordance with claim 16 wherein said seventh transistor and said eighth transistor are high input-impedance emitter-follower.

18. A working point adjusting circuit in accordance with claim 16 wherein said ninth transistor and said tenth transistor are emitter-followers.

19. A working point adjusting circuit in accordance with claim 16 wherein said first diode and second diode are rectifier diodes.

20. A working point adjusting circuit in accordance with claim 16 whereby when said circuit connection means is connected to a Class B complementary symmetry push-pull transistor audio power amplifier, the working point of said transistors in the first and second output stages of said amplifier is adjusted to the level of a Class A power amplifier.

21. In a complimentary symmetry push-pull transistor audio power amplifier having a first NPN transistor and a second PNP transistor in a first input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the first terminal and the positive power supply, a second resistor which is connected between the second terminal and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:

a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to said first terminal;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to said second terminal;
p. a seventh resistor connected between the emitter of said first transistor and the common connecting point of the cathode of said first diode and the emitter of said seventh transistor;
q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;
v. a second output stage supporting a second output terminal further comprising,
  (i) a thirteenth resistor connected between the common connecting point of said bases of said seventh and said eighth transistors and said second output terminal;

(ii) an eleventh NPN transistor having its collector connected to said positive power supply;
(iii) a twelfth PNP transistor having its collector connected to said negative power supply;
(iv) a fourteenth resistor connected between said bases of said eleventh and said twelfth transistors;
(v) a fifteenth resistor connected between the emitter of said eleventh transistor and said second output terminal;
(vi) a sixteenth resistor connected between the emitter of said twelfth transistor and said second output terminal;
(vii) a thirteenth NPN transistor having its collector connected to said positive power supply and its emitter connected to said base of said eleventh transistor;
(viii) a fourteenth PNP transistor having its collector connected to said negative power supply and its emitter connected to said base of said twelfth transistor;
(ix) a seventeenth resistor connected between said bases of said thirteenth and said fourteenth transistors;
w. a second input stage further comprising,
(i) an fifteenth NPN transistor having its collector connected to said positive power supply, its emitter connected to said base of said thirteenth transistor and its base connected to said first terminal;
(ii) a sixteenth PNP transistor having its collector connected to said negative power supply, its emitter connected to said base of said fourteenth transistor and its base connected to said second terminal;
(iii) an eighteenth resistor connected between the base of said fifteenth transistor and said positive power supply; and
(iv) an nineteenth resistor connected between the base of said sixteenth transistor and said negative power supply.

22. A working point adjusting circuit in accordance with claim 21 wherein said seventh transistor and said eighth transistor are high input-impedance emitter-followers.

23. A working point adjusting circuit in accordance with claim 21 wherein said ninth transistor and said tenth transistor are emitter-followers.

24. A working point adjusting circuit in accordance with claim 21 wherein said first diode and second diode are rectifier diodes.

25. A working point adjusting circuit in accordance with claim 21 whereby when said circuit connection means is connected to a Class B complimentary symmetry push-pull transistor audio power amplifier, the working point of said transistors in the first and second output stages of said amplifier is adjusted to the level of a Class A power amplifier.

26. In a complimentary symmetry push-pull transistor audio power amplifier having a first NPN transistor and a second PNP transistor in a first input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to negative power supply, a first resistor which is connected between the first terminal and a positive power supply, a second resistor which is connected between the second terminal and a negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:

a. a seventh transistor which is a PNP transistor;
b. the collector of said seventh transistor connected to the emitter of said second transistor;
c. an eighth transistor which is an NPN transistor;
d. the base of said eighth transistor connected to base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to said first terminal;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to said second terminal;
p. a seventh resistor which is a 120 ohm resistor connected between the emitter of said first transistor and the common connecting point of the cathode of said first diode and the emitter of said seventh transistor;
q. an eighth resistor which is a 120 ohm resistor connected between the emitter of said second transistor and the common connecting point of the anode of said second diode and the emitter of said eighth transistor;
r. a ninth resistor which is a 8.2 kilo-ohm resistor connected between the emitter of said first transistor and the common connecting point of the anode of said first diode and the base of said ninth transistor;
s. a tenth resistor which is a 8.2 kilo-ohm resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;
v. a second output stage supporting a second output terminal further comprising,
(i) a thirteenth resistor connected between the common connecting point of said bases of said seventh and said eighth transistors and said second output terminal;
(ii) an eleventh NPN transistor having its collector connected to said positive power supply;
(iii) a twelfth PNP transistor having its collector connected to said negative power supply;
(iv) a fourteenth resistor connected between said bases of said eleventh and said twelfth transistors;
(v) a fifteenth resistor connected between the emitter of said eleventh transistor and said second output terminal;
(vi) a sixteenth resistor connected between the emitter of said twelfth transistor and said second output terminal;
(vii) a thirteenth NPN transistor having its collector connected to said positive power supply and its emitter connected to said base of said eleventh transistor;
(viii) a fourteenth PNP transistor having its collector connected to said negative power supply and its emitter connected to said base of said twelfth transistor;
(ix) a seventeenth resistor connected between said bases of said thirteenth and said fourteenth transistors;
w. a second input stage further comprising,
(i) an fifteenth NPN transistor having its collector connected to said positive power supply, its emitter connected to said base of said thirteenth transistor and its base connected to said first terminal;
(ii) a sixteenth PNP transistor having its collector connected to said negative power supply, its emitter connected to said base of said fourteenth transistor and its base connected to said second terminal;
(iii) an eighteenth resistor connected between the base of said fifteenth transistor and said positive power supply; and
(vi) an nineteenth resistor connected between the base of said sixteenth transistor and said negative power supply.

27. A working point adjusting circuit in accordance with claim 26 wherein said seventh transistor and said eighth transistor are high input-impedance emitter-follower.

28. A working point adjusting circuit in accordance with claim 26 wherein said ninth transistor and said tenth transistor are emitter-followers.

29. A working point adjusting circuit in accordance with claim 26 wherein said first diode and second diode are rectifier diodes.

30. A working point adjusting circuit in accordance with claim 26 whereby when said circuit connection means is connected to a Class B complimentary symmetry push-pull transistor audio power amplifier, the working point of said transistors in the first and second output stages of said amplifier is adjusted to the level of a Class A power amplifier.

31. In a complimentary symmetry push-pull transistor audio power amplifier having a first terminal which is an input terminal, a second terminal, a first NPN transistor and a second PNP transistor in a first input stage, a third NPN transistor and a fourth PNP transistor, where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the base of the first transistor and the positive power supply, a second resistor which is connected between the base of the second transistor and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:
a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to the base of said first transistor;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to the base of said second transistor;
p. a seventh resistor connected between the emitter of said first transistor and the common connecting point of the cathode of said first diode and the emitter of said seventh transistor;
q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;

t. an eleventh variable resistor connected between the emitters of said ninth transistor and said tenth transistor;

u. a twelfth resistor connected between the common connecting point of said bases of said seventh and said eighth transistors and said first output terminal;

v. a second output stage supporting a second output terminal further comprising,
 (i) an eleventh NPN transistor having its collector connected to said positive power supply;
 (ii) a twelfth PNP transistor having its collector connected to said negative power supply;
 (iii) a fourteenth resistor connected between said bases of said eleventh and said twelfth transistors;
 (iv) a fifteenth resistor connected between the emitter of said eleventh transistor and said second output terminal;
 (v) a sixteenth resistor connected between the emitter of said twelfth transistor and said second output terminal;
 (vi) a thirteenth NPN transistor having its collector connected to said positive power supply and its emitter connected to said base of said eleventh transistor;
 (vii) a fourteenth PNP transistor having its collector connected to said negative power supply and its emitter connected to said base of said twelfth transistor;
 (viii) a seventeenth resistor connected between said bases of said thirteenth and said fourteenth transistors;

w. a second input stage further comprising,
 (i) an fifteenth NPN transistor having its collector connected to said positive power supply and its emitter connected to said base of said thirteenth transistor;
 (ii) a sixteenth PNP transistor having its collector connected to said negative power supply and its emitter connected to said base of said fourteenth transistor;
 (iii) an eighteenth resistor connected between the base of said fifteenth transistor and said positive power supply;
 (vi) an nineteenth resistor connected between the base of said sixteenth transistor and said negative power supply;

x. an additional working point adjusting circuit further comprising,
 (i) a seventeenth PNP transistor having its collector connected to the common connecting point of the base of said fourteenth transistor and the emitter of said sixteenth transistor;
 (ii) an eighteenth NPN transistor having its collector connected to the common connecting point of the base of said thirteenth transistor and the emitter of said fifteenth transistor and its base connected to the base of said seventeenth transistor;
 (iii) a thirteenth resistor connected between the common connecting point of said bases of said seventeenth and said eighteenth transistors and said second output terminal;
 (iv) a third diode having its cathode connected to the emitter of said seventeenth transistor;
 (v) a fourth diode having its anode connected to the emitter of said eighteenth transistor;
 (vi) a nineteenth NPN transistor having its collector connected to the base of said fifteenth transistor and its base connected to the anode of said third diode;
 (vii) a twentieth PNP transistor having its collector connected to the base of said sixteenth transistor and its base connected to the cathode of said fourth diode;
 (viii) a twentieth variable resistor connected between the emitters of said nineteenth and said twentieth transistors;
 (ix) a twenty-first resistor connected between the common connecting point of the base of said thirteenth transistor and the emitter of said fifteenth transistor and the common connecting point of the emitter of said seventeenth transistor and the cathode of said third diode;
 (x) a twenty-second resistor connected between the common connecting point of the base of said fourteenth transistor and the emitter of said sixteenth transistor and the common connecting point of the emitter of said eighteenth transistor and the anode of said fourth diode;
 (xi) a twenty-third resistor connected between the common connecting point of the base of said thirteenth transistor and the emitter of said fifteenth transistor and the common connecting point of the base of said nineteenth transistor and the anode of said third diode;
 (xii) a twenty-fourth resistor connected between the common connecting point of the base of said fourteenth transistor and the emitter of said sixteenth transistor and the common connecting point of the base of said twentieth transistor and the cathode of said fourth diode;

y. a circuit connecting means further comprising,
 (i) a twenty-fifth resistor connected between the first terminal and the common connecting point of the base of said first transistor and the collector of said nineth transistor;
 (ii) a twenty-sixth resistor connected between the second terminal and the common connecting point of the base of said second transistor and the collector of said tenth transistor;
 (iii) a twenty-seventh resistor connected between the first terminal and the common connecting point of the base of said fifteenth transistor and the collector of said nineteenth transistor; and
 (vi) a twenty-eighth resistor connected between the second terminal and the common connecting point of the base of said sixteenth transistor and the collector of said twentieth transistor.

32. A working point adjusting circuit in accordance with claim 31 wherein said seventh transistor, said eighth transistor, said seventeenth transistor and said eighteenth transistor are high input-impedance emitter-followers.

33. A working point adjusting circuit in accordance with claim 31 wherein said ninth transistor, said tenth transistor, said nineteenth transistor and said twentieth transistor are emitter-followers.

34. A working point adjusting circuit in accordance with claim 31 wherein said first diode, said second diode, said third diode and said fourth diode are rectifier diodes.

35. A working point adjusting circuit in accordance with claim 31 whereby when said circuit connection means is connected to a Class B complimentary symmetry push-pull transistor audio power amplifier, the working point of said transistors in the first output stage and the working point of said transistors in the second output stage are adjusted independently to the level of a Class A power amplifier.

36. In a complimentary symmetry push-pull transistor audio power amplifier having a first terminal which is an input terminal, a second terminal, a first NPN transistor and a second PNP transistor in a first input stage, a third NPN transistor and a fourth PNP transistor, where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the base of the first transistor and the positive power supply, a second resistor which is connected between the base of the second transistor and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:
  a. a seventh transistor which is a PNP transistor;
  b. the collector of said seventh transistor connected to the emitter of said second transistor;
  c. an eighth transistor which is an NPN transistor;
  d. the base of said eighth transistor connected to said base of said seventh transistor;
  e. the collector of said eighth transistor connected to the emitter of said first transistor;
  f. a first diode;
  g. the cathode of said first diode connected to the emitter of said seventh transistor;
  h. a ninth transistor which is an NPN transistor;
  i. the base of said ninth transistor connected to the anode of said first diode;
  j. the collector of said ninth transistor connected to the base of said first transistor;
  k. a second diode;
  l. the anode of said second diode connected to the emitter of said eighth transistor;
  m. a tenth transistor which is a PNP transistor;
  n. the base said tenth transistor connected to the cathode of said second diode;
  o. the collector of said tenth transistor connected to the base of said second transistor;
  p. a seventh resistor which is a 120 ohm resistor connected between the emitter of said first transistor and the common connecting point of the cathode of said first diode and the emitter of said seventh transistor;
  q. an eighth resistor which is a 120 ohm resistor connected between the emitter of said second transistor and the common connecting point of the anode of said second diode and the emitter of said eighth transistor;
  r. a ninth resistor which is a 8.2 kilo-ohm resistor connected between the emitter of said first transistor and the common connecting point of the anode of said first diode and the base of said ninth transistor;
  s. a tenth resistor which is a 8.2 kilo-ohm resistor connected between the emitter of said second transistor and the common connecting point of the cathode of said second diode and the base of said tenth transistor;
  t. an eleventh variable resistor connected between the emitters of said ninth transistor and said tenth transistor;
  u. a twelfth resistor connected between the common connecting point of said bases of said seventh and said eighth transistors and said first output terminal;
  v. a second output stage supporting a second output terminal further comprising,
    (i) an eleventh NPN transistor having its collector connected to said positive power supply;
    (ii) a twelfth PNP transistor having its collector connected to said negative power supply;
    (iii) a fourteenth resistor connected between said bases of said eleventh and said twelfth transistors;
    (iv) a fifteenth resistor connected between the emitter of said eleventh transistor and said second output terminal;
    (v) a sixteenth resistor connected between the emitter of said twelfth transistor and said second output terminal;
    (vi) a thirteenth NPN transistor having its collector connected to said positive power supply and its emitter connected to said base of said eleventh transistor;
    (vii) a fourteenth PNP transistor having its collector connected to said negative power supply and its emitter connected to said base of said twelfth transistor;
    (viii) a seventeenth resistor connected between said bases of said thirteenth and said fourteenth transistors;
  w. a second input stage further comprising,
    (i) an fifteenth NPN transistor having its collector connected to said positive power supply and its emitter connected to said base of said thirteenth transistor;
    (ii) a sixteenth PNP transistor having its collector connected to said negative power supply and its emitter connected to said base of said fourteenth transistor;
    (iii) an eighteenth resistor connected between the base of said fifteenth transistor and said positive power supply;
    (vi) an nineteenth resistor connected between the base of said sixteenth transistor and said negative power supply;
  x. an additional working point adjusting circuit further comprising,
    (i) a seventeenth PNP transistor having its collector connected to the common connecting point of the base of said fourteenth transistor and the emitter of said sixteenth transistor;
    (ii) an eighteenth NPN transistor having its collector connected to the common connecting point of the base of said thirteenth transistor and the emitter of said fifteenth transistor and its base connected to the base of said seventeenth transistor;
(iii) a thirteenth resistor connected between the common connecting point of said bases of said seventeenth and said eighteenth transistors and said second output terminal;
(iv) a third diode having its cathode connected to the emitter of said seventeenth transistor;
(v) a fourth diode having its anode connected to the emitter of said eighteenth transistor;
(vi) a nineteenth NPN transistor having its collector connected to the base of said fifteenth transistor and its base connected to the anode of said third diode;
(vii) a twentieth PNP transistor having its collector connected to the base of said sixteenth transistor and its base connected to the cathode of said fourth diode;
(viii) a twentieth variable resistor connected between the emitters of said nineteenth and said twentieth transistors;
(ix) a twenty-first resistor which is a 120 ohm resistor connected between the common connecting point of the base of said thirteenth transistor and the emitter of said fifteenth transistor and the common connecting point of the emitter of said seventeenth transistor and the cathode of said third diode;
(x) a twenty-second resistor which is a 120 ohm resistor connected between the common connecting point of the base of said fourteenth transistor and the emitter of said sixteenth transistor and the common connecting point of the emitter of said eighteenth transistor and the anode of said fourth diode;
(xi) a twenty-third resistor which is a 8.2 kilo-ohm resistor connected between the common connecting point of the base of said thirteenth transistor and the emitter of said fifteenth transistor and the common connecting point of the base of said nineteenth transistor and the anode of said third diode;
(xii) a twenty-fourth resistor which is a 8.2 kilo-ohm resistor connected between the common connecting point of the base of said fourteenth transistor and the emitter of said sixteenth transistor and the common connecting point of the base of said twentieth transistor and the cathode of said fourth diode;
y. a circuit connecting means further comprising,
(i) a twenty-fifth resistor connected between the first terminal and the common connecting point of the base of said first transistor and the collector of said nineth transistor;
(ii) a twenty-sixth resistor connected between the second terminal and the common connecting point of the base of said second transistor and the collector of said tenth transistor;
(iii) a twenty-seventh resistor connected between the first terminal and the common connecting point of the base of said fifteenth transistor and the collector of said nineteenth transistor; and
(vi) a twenty-eighth resistor connected between the second terminal and the common connecting point of the base of said sixteenth transistor and the collector of said twentieth transistor.

37. A working point adjusting circuit in accordance with claim 36 wherein said seventh transistor, said eighth transistor, said seventeenth transistor and said eighteenth transistor are high input-impedance emitter-follower.

38. A working point adjusting circuit in accordance with claim 36 wherein said ninth transistor, said tenth transistor, said nineteenth transistor and said twentieth transistor are emitter-followers.

39. A working point adjusting circuit in accordance with claim 36 wherein said first diode, said second diode, said third diode and said fourth diode are rectifier diodes.

40. A working point adjusting circuit in accordance with claim 36 whereby when said circuit connection means is connected to a Class B complimentary symmetry push-pull transistor audio power amplifier, the working point of said transistors in the first output stage and the working point of said transistors in the second output stage are adjusted independently to the level of a Class A power amplifier.

41. In a complimentary symmetry push-pull transistor audio power amplifier having a first terminal which is an input terminal, a second terminal, a first NPN transistor and a second PNP transistor in a first input stage, a third NPN transistor and a fourth PNP transistor, where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a first positive power supply and the collectors of the second transistor, the fourth transistor and the sixth transistor are connected to a first negative power supply, a first resistor which is connected between the base of the first transistor and the first positive power supply, a second resistor which is connected between the base of the second transistor and the first negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:
a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to the base of said first transistor;
k. a second diode;
l. the anode of said second diode connected to the emitter of said eighth transistor;
m. a tenth transistor which is a PNP transistor;

n. the base said tenth transistor connected to the cathode of said second diode;
o. the collector of said tenth transistor connected to the base of said second transistor;
p. a seventh resistor connected between the emitter of said first transistor and the common connecting point of the cathode of said first diode and the emitter of said seventh transistor;
q. an eighth resistor connected between the emitter of said second transistor and the common connecting point of the anode of said second diode and the emitter of said eighth transistor;
r. a ninth resistor connected between the emitter of said first transistor and the common connecting point of the anode of said first diode and the base of said ninth transistor;
s. a tenth resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;
v. a second output stage supporting a second output terminal further comprising,
  (i) an eleventh NPN transistor having its collector connected to a second positive power supply;
  (ii) a twelfth PNP transistor having its collector connected to a second negative power supply;
  (iii) a fourteenth resistor connected between said bases of said eleventh and said twelfth transistors;
  (iv) a fifteenth resistor connected between the emitter of said eleventh transistor and said second output terminal;
  (v) a sixteenth resistor connected between the emitter of said twelfth transistor and said second output terminal;
  (vi) a thirteenth NPN transistor having its collector connected to said second positive power supply and its emitter connected to said base of said eleventh transistor;
  (vii) a fourteenth PNP transistor having its collector connected to said second negative power supply and its emitter connected to said base of said twelfth transistor;
  (viii) a seventeenth resistor connected between said bases of said thirteenth and said fourteenth transistors;
w. a second input stage further comprising,
  (i) an fifteenth NPN transistor having its collector connected to said second positive power supply and its emitter connected to said base of said thirteenth transistor;
  (ii) a sixteenth PNP transistor having its collector connected to said second negative power supply and its emitter connected to said base of said fourteenth transistor;
  (iii) an eighteenth resistor connected between the base of said fifteenth transistor and said second positive power supply;
  (vi) an nineteenth resistor connected between the base of said sixteenth transistor and said second negative power supply;
x. an additional working point adjusting circuit further comprising,
  (i) a seventeenth PNP transistor having its collector connected to the common connecting point of the base of said fourteenth transistor and the emitter of said sixteenth transistor;
  (ii) an eighteenth NPN transistor having its collector connected to the common connecting point of the base of said thirteenth transistor and the emitter of said fifteenth transistor and its base connected to the base of said seventeenth transistor;
  (iii) a thirteenth resistor connected between the common connecting point of said bases of said seventeenth and said eighteenth transistors and said second output terminal;
  (iv) a third diode having its cathode connected to the emitter of said seventeenth transistor;
  (v) a fourth diode having its anode connected to the emitter of said eighteenth transistor;
  (vi) a nineteenth NPN transistor having its collector connected to the base of said fifteenth transistor and its base connected to the anode of said third diode;
  (vii) a twentieth PNP transistor having its collector connected to the base of said sixteenth transistor and its base connected to the cathode of said fourth diode;
  (viii) a twentieth variable resistor connected between the emitters of said nineteenth and said twentieth transistors;
  (ix) a twenty-first resistor connected between the common connecting point of the base of said thirteenth transistor and the emitter of said fifteenth transistor and the common connecting point of the emitter of said seventeenth transistor and the cathode of said third diode;
  (x) a twenty-second resistor connected between the common connecting point of the base of said fourteenth transistor and the emitter of said sixteenth transistor and the common connecting point of the emitter of said eighteenth transistor and the anode of said fourth diode;
  (xi) a twenty-third resistor connected between the common connecting point of the base of said thirteenth transistor and the emitter of said fifteenth transistor and the common connecting point of the base of said nineteenth transistor and the anode of said third diode;
  (xii) a twenty-fourth resistor connected between the common connecting point of the base of said fourteenth transistor and the emitter of said sixteenth transistor and the common connecting point of the base of said twentieth transistor and the cathode of said fourth diode;
y. a circuit connecting means further comprising,
  (i) a twenty-fifth resistor connected between the first terminal and the common connecting point of the base of said first transistor and the collector of said nineth transistor;
  (ii) a twenty-sixth resistor connected between the second terminal and the common connecting point of the base of said second transistor and the collector of said tenth transistor;
  (iii) a twenty-seventh resistor connected between the first terminal and the common connecting point of the base of said fifteenth transistor and the collector of said nineteenth transistor; and (vi) a twenty-eighth resistor connected between the second terminal and the common connecting point of the base of said sixteenth transistor and the collector of said twentieth transistor.

42. A working point adjusting circuit in accordance with claim 41 wherein said seventh transistor, said eighth transistor, said seventeenth transistor and said eighteenth transistor are high input-impedance emitter-followers.

43. A working point adjusting circuit in accordance with claim 41 wherein said ninth transistor, said tenth transistor, said nineteenth transistor and said twentieth transistor are emitter-followers.

44. A working point adjusting circuit in accordance with claim 41 wherein said first diode, said second diode, said third diode and said fourth diode are rectifier diodes.

45. A working point adjusting circuit in accordance with claim 41 whereby when said circuit connection means is connected to a Class B complimentary symmetry push-pull transistor audio power amplifier, the working point of said transistors in the first output stage and the working point of said transistors in the second output stage are adjusted independently to the level of a Class A power amplifier.

46. In a complimentary symmetry push-pull transistor audio power amplifier having a first terminal which is an input terminal, a second terminal, a first NPN transistor and a second PNP transistor in a first input stage, a third NPN transistor and a fourth PNP transistor, where the first transistor and the third transistor, the second transistor and the fourth transistor are respectively Darlington connected, a fifth NPN transistor and a sixth PNP transistor in a first output stage, where the third transistor and the fifth transistor, the fourth transistor and the sixth transistor are also respectively Darlington connected and where the collectors of the first transistor, the third transistor and the fifth transistor are connected to a first positive power supply and the collectors of the second transistor, the fourth transistor and the sixth transistor are connected to a first negative power supply, a first resistor which is connected between the base of the first transistor and the first positive power supply, a second resistor which is connected between the base of the second transistor and the first negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a first output terminal, a working point adjusting circuit comprising:

a. a seventh transistor which is a PNP transistor;
b. the collector of said seventh transistor connected to the emitter of said second transistor;
c. an eighth transistor which is an NPN transistor;
d. the base of said eighth transistor connected to said base of said seventh transistor;
e. the collector of said eighth transistor connected to the emitter of said first transistor;
f. a first diode;
g. the cathode of said first diode connected to the emitter of said seventh transistor;
h. a ninth transistor which is an NPN transistor;
i. the base of said ninth transistor connected to the anode of said first diode;
j. the collector of said ninth transistor connected to the base of said first transistor;
k. a second diode;
l. the anode of said second diode connected to the emitter of said eighth transistor;
m. a tenth transistor which is a PNP transistor;
n. the base said tenth transistor connected to the cathode of said second diode;
o. the collector of said tenth transistor connected to the base of said second transistor;
p. a seventh resistor which is a 120 ohm resistor connected between the emitter of said first transistor and the common connecting point of the cathode of said first diode and the emitter of said seventh transistor;
q. an eighth resistor which is a 120 ohm resistor connected between the emitter of said second transistor and the common connecting point of the anode of said second diode and the emitter of said eighth transistor;
r. a ninth resistor which is a 8.2 kilo-ohm resistor connected between the emitter of said first transistor and the common connecting point of the anode of said first diode and the base of said ninth transistor;
s. a tenth resistor which is a 8.2 kilo-ohm resistor connected between the emitter of said second transistor and the common connecting point of the cathode of said second diode and the base of said tenth transistor;
t. an eleventh variable resistor connected between the emitters of said ninth transistor and said tenth transistor;
u. a twelfth resistor connected between the common connecting point of said bases of said seventh and said eighth transistors and said first output terminal;
v. a second output stage supporting a second output terminal further comprising,
  (i) an eleventh NPN transistor having its collector connected to a second positive power supply;
  (ii) a twelfth PNP transistor having its collector connected to a second negative power supply;
  (iii) a fourteenth resistor connected between said bases of said eleventh and said twelfth transistors;
  (iv) a fifteenth resistor connected between the emitter of said eleventh transistor and said second output terminal;
  (v) a sixteenth resistor connected between the emitter of said twelfth transistor and said second output terminal;
  (vi) a thirteenth NPN transistor having its collector connected to said second positive power supply and its emitter connected to said base of said eleventh transistor;
  (vii) a fourteenth PNP transistor having its collector connected to said second negative power supply and its emitter connected to said base of said twelfth transistor;
  (viii) a seventeenth resistor connected between said bases of said thirteenth and said fourteenth transistors;
w. a second input stage further comprising,
  (i) an fifteenth NPN transistor having its collector connected to said second positive power supply and its emitter connected to said base of said thirteenth transistor;

(ii) a sixteenth PNP transistor having its collector connected to said second negative power supply and its emitter connected to said base of said fourteenth transistor;

(iii) an eighteenth resistor connected between the base of said fifteenth transistor and said second positive power supply;

(vi) an nineteenth resistor connected between the base of said sixteenth transistor and said second negative power supply;

x. an additional working point adjusting circuit further comprising, (i) a seventeenth PNP transistor having its collector connected to the common connecting point of the base of said fourteenth transistor and the emitter of said sixteenth transistor;

(ii) an eighteenth NPN transistor having its collector connected to the common connecting point of the base of said thirteenth transistor and the emitter of said fifteenth transistor and its base connected to the base of said seventeenth transistor;

(iii) a thirteenth resistor connected between the common connecting point of said bases of said seventeenth and said eighteenth transistors and said second output terminal;

(iv) a third diode having its cathode connected to the emitter of said seventeenth transistor;

(v) a fourth diode having its anode connected to the emitter of said eighteenth transistor;

(vi) a nineteenth NPN transistor having its collector connected to the base of said fifteenth transistor and its base connected to the anode of said third diode;

(vii) a twentieth PNP transistor having its collector connected to the base of said sixteenth transistor and its base connected to the cathode of said fourth diode;

(viii) a twentieth variable resistor connected between the emitters of said nineteenth and said twentieth transistors;

(ix) a twenty-first resistor which is a 120 ohm resistor connected between the common connecting point of the base of said thirteenth transistor and the emitter of said fifteenth transistor and the common connecting point of the emitter of said seventeenth transistor and the cathode of said third diode;

(x) a twenty-second resistor which is a 120 ohm resistor connected between the common connecting point of the base of said fourteenth transistor and the emitter of said sixteenth transistor and the common connecting point of the emitter of said eighteenth transistor and the anode of said fourth diode;

(xi) a twenty-third resistor which is a 8.2 kilo-ohm resistor connected between the common connecting point of the base of said thirteenth transistor and the emitter of said fifteenth transistor and the common connecting point of the base of said nineteenth transistor and the anode of said third diode;

(xii) a twenty-fourth resistor which is a 8.2 kilo-ohm resistor connected between the common connecting point of the base of said fourteenth transistor and the emitter of said sixteenth transistor and the common connecting point of the base of said twentieth transistor and the cathode of said fourth diode;

y. a circuit connecting means further comprising, (i) a twenty-fifth resistor connected between the first terminal and the common connecting point of the base of said first transistor and the collector of said nineth transistor;

(ii) a twenty-sixth resistor connected between the second terminal and the common connecting point of the base of said second transistor and the collector of said tenth transistor;

(iii) a twenty-seventh resistor connected between the first terminal and the common connecting point of the base of said fifteenth transistor and the collector of said nineteenth transistor; and (vi) a twenty-eighth resistor connected between the second terminal and the common connecting point of the base of said sixteenth transistor and the collector of said twentieth transistor.

47. A working point adjusting circuit in accordance with claim 46 wherein said seventh transistor, said eighth transistor, said seventeenth transistor and said eighteenth transistor are high input-impedance emitter-follower.

48. A working point adjusting circuit in accordance with claim 46 wherein said ninth transistor, said tenth transistor, said nineteenth transistor and said twentieth transistor are emitter-followers.

49. A working point adjusting circuit in accordance with claim 46 wherein said first diode, said second diode, said third diode and said fourth diode are rectifier diodes.

50. A working point adjusting circuit in accordance with claim 46 whereby when said circuit connection means is connected to a Class B complimentary symmetry push-pull transistor audio power amplifier, the working point of said transistors in the first output stage and the working point of said transistors in the second output stage are adjusted independently to the level of a Class A power amplifier.

51. For a power amplifier circuit having an input circuit means including at least one transistor connected to an input terminal, two output push-pull power amplifier circuit means supporting two output terminals respectively, each output circuit means including at least one pair of amplifying transistors connected to a respective one of the two output terminals, and means for connecting the input and the two output circuit means together and to a power supply means, a working point adjusting circuit, comprising, a. a pair of switching transistor means and a pair of biasing transistor means, in addition to said at least one transistor means of said input circuit means and said at least one pair of transistors means of each one of said two output circuit means of said power amplifier circuit, where the bases of the pair of switching transistor means are connected to each of said two output terminals, and the collectors of the pair of biasing transistor means are connected to said input terminal;

b. a first diode means connected between the emitter of a respective one of said pair of switching transistor means and the base of a respective one of said pair of biasing transistor means, where the respective one of said pair of switching transistor means and the first diode means act to provide a first switching means, which when open, causes the respective one of said pair of biasing transistor means to be closed;

c. a second diode means connected between the emitter of another respective one of said pair of switching transistor means and the base of another respective one of said pair of biasing transistor means, where the other respective one of said pair of switching transistor means and the second diode means act to provide a second switching means, which when open, causes the other respective one of said pair of biasing transistor means to be closed;

d. a variable resistor connected between the emitters of said pair of biasing transistor means; and e. circuit connector means for connecting said working point adjusting circuit to said power amplifier circuit.

52. A working point adjusting circuit in accordance with claim 51 wherein said pair of switching transistor means are high input-impedance emitter-follower transistors.

53. A working point adjusting circuit in accordance with claim 51 wherein said pair of biasing transistor means are emitter-follower transistors.

54. A working point adjusting circuit in accordance with claim 51 wherein said first and second diodes are rectifier diodes.

55. A working point adjusting circuit in accordance with claim 51 whereby when said circuit connector means is connected to a Class B power amplifier having two output push-pull power amplifier circuit means each including at least one pair of transistors means, the working point of the at least one pair of transistors means of each one of said two output circuit means of the Class B power amplifier can be adjusted by the working point adjusting circuit to the level of a Class A power amplifier.

56. For a power amplifier circuit having two input circuit means each including at least one transistor connected to an input terminal, two output push-pull power amplifier circuit means supporting two output terminals respectively, each output circuit means including at least one pair of amplifying transistors connected to a respective one of the two output terminals, and means for connecting the two input and the two output circuit means together and to a power supply means, a working point adjusting circuit, comprising, a. a pair of switching transistor means and a pair of biasing transistor means, in addition to said at least one transistor means of each one of said two input circuit means and said at least one pair of transistors means of each one of said two output circuit means of said power amplifier circuit, where the bases of the pair of switching transistor means are connected to each of said two output terminals, and the collectors of the pair of biasing transistor means are connected to said input terminal;

b. a first diode means connected between the emitter of a respective one of said pair of switching transistor means and the base of a respective one of said pair of biasing transistor means, where the respective one of said pair of switching transistor means and the first diode means act to provide a first switching means, which when open, causes the respective one of said pair of biasing transistor means to be closed;

c. a second diode means connected between the emitter of another respective one of said pair of switching transistor means and the base of another respective one of said pair of biasing transistor means, where the other respective one of said pair of switching transistor means and the second diode means act to provide a second switching means, which when open, causes the other respective one of said pair of biasing transistor means to be closed;

d. a variable resistor connected between the emitters of said pair of biasing transistor means; and e. circuit connector means for connecting said working point adjusting circuit to said power amplifier circuit.

57. A working point adjusting circuit in accordance with claim 56 wherein said pair of switching transistor means are high input-impedance emitter-follower transistors.

58. A working point adjusting circuit in accordance with claim 56 wherein said pair of biasing transistor means are emitter-follower transistors.

59. A working point adjusting circuit in accordance with claim 56 wherein said first and second diodes are rectifier diodes.

60. A working point adjusting circuit in accordance with claim 56 whereby when said circuit connector means is connected to a Class B power amplifier having two output push-pull power amplifier circuit means each including at least one pair of transistors means, the working point of the at least one pair of transistors means of each one of said two output circuit means of the Class B power amplifier can be adjusted by the working point adjusting circuit to the level of a Class A power amplifier.

61. For a power amplifier circuit having two input circuit means each including at least one transistor connected to an input terminal, two output push-pull power amplifier circuit means supporting two output terminals respectively, each output circuit means including at least one pair of amplifying transistors connected to a respective one of the two output terminals, and means for connecting the two input and the two output circuit means to two power supply means respectively, a working point adjusting circuit, comprising, a. a first pair of switching transistor means and a first pair of biasing transistor means, in addition to said at least one transistor means of each one of said two input circuit means and said at least one pair of transistors means of each one of said two output circuit means of said power amplifier circuit, where the bases of the first pair of switching transistor means are connected to a first one of said two output terminals, and the collectors of the first pair of biasing transistor means are connected to said input terminal;

b. a first diode means connected between the emitter of a respective one of said first pair of switching transistor means and the base of a respective one of said first pair of biasing transistor means, where the respective one of said first pair of switching transistor means and the first diode means act to provide a first switching means, which when open, causes the respective one of said first pair of biasing transistor means to be closed;

c. a second diode means connected between the emitter of another respective one of said first pair of switching transistor means and the base of another respective one of said first pair of biasing transistor means, where the other respective one of said first pair of switching transistor means and the second diode means act to provide a second switching means, which when open, causes the other respective one of said first pair of biasing transistor means to be closed;

d. a first variable resistor connected between the emitters of said first pair of biasing transistor means;

e. a second pair of switching transistor means and a second pair of biasing transistor means, in addition to said at least one transistor means of each one of said two input circuit means and said at least one pair of transistors means of each one of said two output circuit means of said power amplifier circuit, where the bases of the second pair of switching transistor means are connected to a second one of said two output terminals, and the collectors of the second pair of biasing transistor means are connected to said input terminal;

f. a third diode means connected between the emitter of a respective one of said second pair of switching transistor means and the base of a respective one of said second pair of biasing transistor means, where the respective one of said second pair of switching transistor means and the third diode means act to provide a third switching means, which when open, causes the respective one of said second pair of biasing transistor means to be closed;

g. a fourth diode means connected between the emitter of another respective one of said second pair of switching transistor means and the base of another respective one of said second pair of biasing transistor means, where the other respective one of said second pair of switching transistor means and the fourth diode means act to provide a fourth switching means, which when open, causes the other respective one of said second pair of biasing transistor means to be closed;

h. a second variable resistor connected between the emitters of said first pair of biasing transistor means; and i. circuit connector means for connecting said working point adjusting circuit to said power amplifier circuit.

62. A working point adjusting circuit in accordance with claim 61 wherein said first and second pairs of switching transistor means are high input-impedance emitter-follower transistors.

63. A working point adjusting circuit in accordance with claim 61 wherein said first and second pairs of biasing transistor means are emitter-follower transistors.

64. A working point adjusting circuit in accordance with claim 61 wherein said first diode, said second diode, said third diode and said fourth diode are rectifier diodes.

65. A working point adjusting circuit in accordance with claim 61 whereby when said circuit connector means is connected to a Class B power amplifier having two output push-pull power amplifier circuit means each including at least one pair of transistors means, the working point of the at least one pair of transistors means of one of said two output circuit means and the working point of the at least one pair of transistors means of another one of said two output circuit means can be adjusted independently by the working point adjusting circuit to the level of a Class A power amplifier.

66. For a power amplifier circuit having a multiplicity of input circuit means each including at least one transistor connected to an input terminal, a multiplicity of output push-pull power amplifier circuit means supporting a multiplicity of output terminals respectively, each output circuit means including at least one pair of amplifying transistors connected to a respective one of the multiplicity of output terminals, and means for connecting the multiplicity of input and the multiplicity of output circuit means to a multiplicity on power supply means respectively, a working point adjusting circuit comprising a multiplicity of working point adjusting means, each one of the multiplicity of working point adjusting means further comprising, a. a pair of switching transistor means and a pair of biasing transistor means, in addition to said at least one transistor means of each one of said multiplicity of input circuit means and said at least one pair of transistors means of each one of said multiplicity of output circuit means of said power amplifier circuit, where the bases of the pair of switching transistor means are connected to a respective one of said multiplicity of output terminals, and the collectors of the pair of baising transistor means are connected to said input terminal;

b. a first diode means connected between the emitter of a respective one of said pair of switching transistor means and the base of a respective one of said pair of biasing transistor means, where the respective one of said pair of switching transistor means and the first diode means act to provide a first switching means, which when open, causes the respective one of said pair of biasing transistor means to be closed;

c. a second diode means connected between the emitter of another respective one of said pair of switching transistor means and the base of another respective one of said pair of biasing transistor means, where the other respective one of said pair of switching transistor means and the second diode respective one of said pair of switching transistor means and the second diode means act to provide a second switching means, which when open, causes the other respective one of said pair of biasing transistor means to be closed;

d. a variable resistor connected between the emitters of said pair of biasing transistor means; and e. circuit connector means for connecting said working point adjusting means to said power amplifier circuit.

67. A working point adjusting circuit in accordance with claim 66 wherein said pair of switching transistor means of each one of said multiplicity of working point adjusting means are high input-impedance emitter-follower transistors.

68. A working point adjusting circuit in accordance with claim 66 wherein said pair of biasing transistor means of each one of said multiplicity of working point adjusting means are emitter-follower transistors.

69. A working point adjusting circuit in accordance with claim 66 wherein said first and second diodes of each one of said multiplicity of working point adjusting means are rectifier diodes.

70. A working point adjusting circuit in accordance with claim 66 whereby when said circuit connector means is connected to a Class B power amplifier having a multiplicity of output push-pull power amplifier circuit means each including at least one pair of transistors means, the working point of the at least one pair of transistors means of each one of said multiplicity of output circuit means of the Class B power amplifier can be adjusted independently by a respective one of said multiplicity of working point adjusting means to the level of a Class A power amplifier.

* * * * *